(12) United States Patent
Butler et al.

(10) Patent No.: US 6,820,103 B2
(45) Date of Patent: Nov. 16, 2004

(54) DIGITAL FILTER WITH STATE STORAGE

(75) Inventors: Brian K. Butler, La Jolla, CA (US); Deepu John, San Diego, CA (US); Haitao Zhang, San Diego, CA (US); Mohammad J. Mohseni, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 295 days.

(21) Appl. No.: 10/003,913

(22) Filed: Oct. 31, 2001

(65) Prior Publication Data

US 2002/0131487 A1 Sep. 19, 2002

Related U.S. Application Data

(60) Provisional application No. 60/245,229, filed on Nov. 3, 2000.

(51) Int. Cl.[7] .......................... G06F 17/10; G06F 17/17
(52) U.S. Cl. ....................................... 708/319; 708/313
(58) Field of Search ................................ 708/319, 316

(56) References Cited

U.S. PATENT DOCUMENTS

| | | | |
|---|---|---|---|
| 5,369,606 A | 11/1994 | Hessel | |
| 5,566,101 A | 10/1996 | Kodra | |
| 5,586,068 A | 12/1996 | Rakib | |
| 5,870,431 A | 2/1999 | Easton et al. | |
| 5,912,827 A | * 6/1999 | Sasaki | ......................... 708/319 |
| 5,966,314 A | 10/1999 | Lee | |
| 6,138,132 A | * 10/2000 | Lee et al. | ................... 708/313 |

FOREIGN PATENT DOCUMENTS

| | | |
|---|---|---|
| EP | 0580924 | 7/1992 |
| EP | 0690566 | 6/1994 |

OTHER PUBLICATIONS

Duncan, et al., *Strategies for Design Automation of High Speed Digital Filters*; 8367 Journal of VLSI Signal Processing 9, 105–119 (1995).

* cited by examiner

*Primary Examiner*—Tan V Mai
(74) *Attorney, Agent, or Firm*—Philip R. Wadsworth; Charles D. Brown; Timothy F. Loomis

(57) ABSTRACT

A system for digital filtering includes a set of logic gates, a state storage, and a multiplexer. The state storage includes two or more storage banks and may also include combinatorial logic and/or at least one lookup table. In one application, a filtering operation according to a finite-impulse-response filter coefficient vector is performed without runtime multiplications. Applications to symmetric and antisymmetric filter coefficient vectors are described, as well as applications to filter coefficient vectors of arbitrary odd or even length.

22 Claims, 32 Drawing Sheets

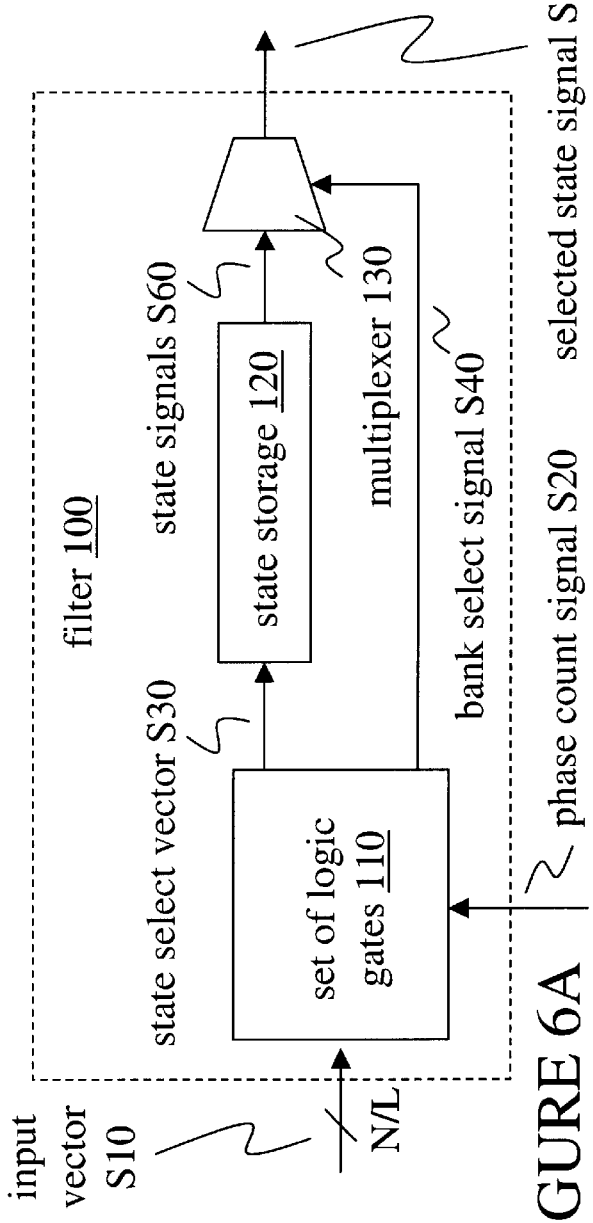
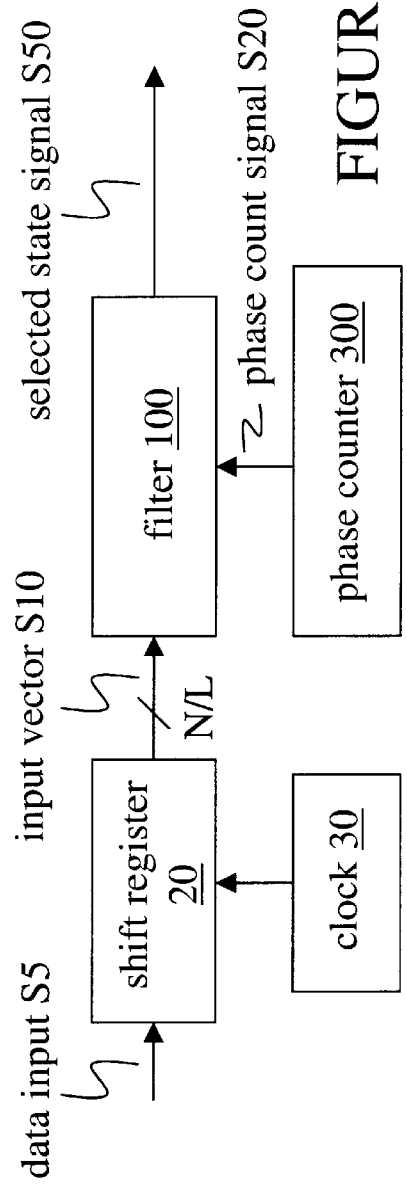

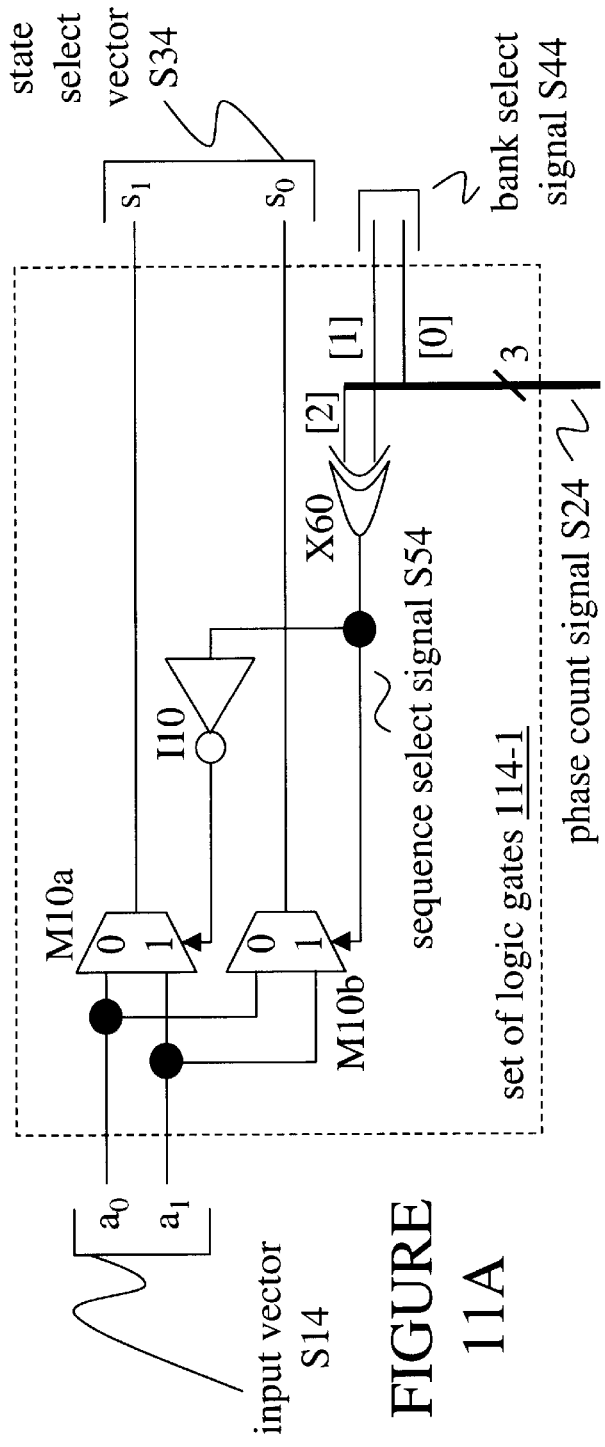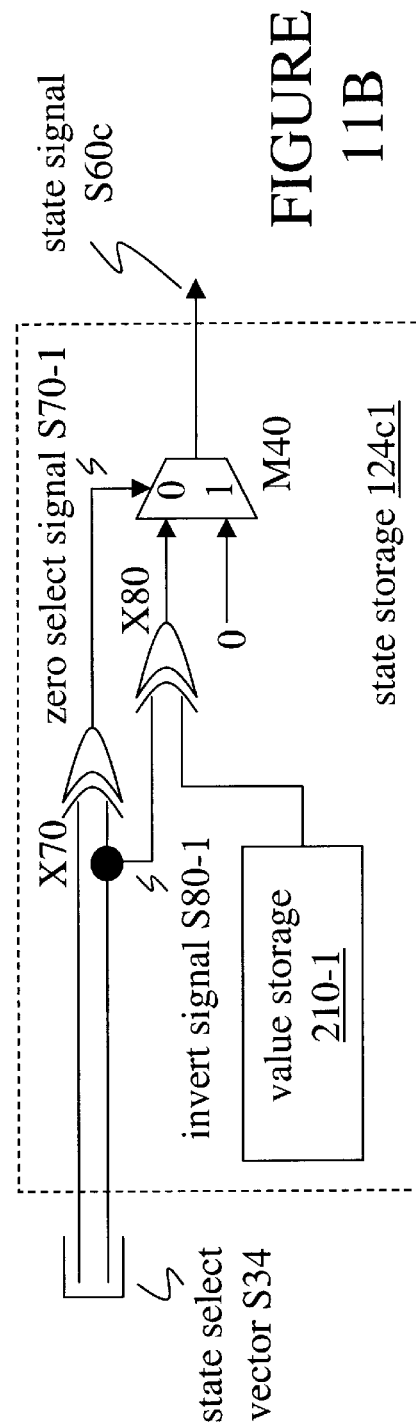
FIGURE 11A
FIGURE 11B bank 0, sequence 0
bank 1, sequence 0
bank 1, sequence 1
bank 0, sequence 1

FIGURE 31A phase 0: $y_n = a_0h_0 + a_1h_4 + a_2h_8 + a_3h_{12} + a_4h_{16} + a_5h_{20} + a_6h_{23} + a_7h_{19} + a_8h_{15} + a_9h_{11} + a_{10}h_7 + a_{11}h_3$ phase 1: $y_n = a_0h_1 + a_1h_5 + a_2h_9 + a_3h_{13} + a_4h_{17} + a_5h_{21} + a_6h_{22} + a_7h_{18} + a_8h_{14} + a_9h_{10} + a_{10}h_6 + a_{11}h_2$ phase 2: $y_n = a_0h_2 + a_1h_6 + a_2h_{10} + a_3h_{14} + a_4h_{18} + a_5h_{22} + a_6h_{21} + a_7h_{17} + a_8h_{13} + a_9h_9 + a_{10}h_5 + a_{11}h_1$ phase 3: $y_n = a_0h_3 + a_1h_7 + a_2h_{11} + a_3h_{15} + a_4h_{19} + a_5h_{23} + a_6h_{20} + a_7h_{16} + a_8h_{12} + a_9h_8 + a_{10}h_4 + a_{11}h_0$

FIGURE 31B

Block A:
phase 0: $y_n = a_0h_0 + a_1h_4 + a_2h_8 + a_{11}h_3$
phase 1: $y_n = a_0h_1 + a_1h_5 + a_2h_9 + a_{11}h_2$
phase 2: $y_n = a_0h_2 + a_1h_6 + a_2h_{10} + a_{11}h_1$
phase 3: $y_n = a_0h_3 + a_1h_7 + a_2h_{11} + a_{11}h_0$ Block B:
phase 0: $+\ a_3h_{12} + a_8h_{15} + a_9h_{11} + a_{10}h_7$
phase 1: $+\ a_3h_{13} + a_8h_{14} + a_9h_{10} + a_{10}h_6$
phase 2: $+\ a_3h_{14} + a_8h_{13} + a_9h_9 + a_{10}h_5$
phase 3: $+\ a_3h_{15} + a_8h_{12} + a_9h_8 + a_{10}h_4$ Block C:
phase 0: $+\ a_4h_{16} + a_5h_{20} + a_6h_{23} + a_7h_{19}$
phase 1: $+\ a_4h_{17} + a_5h_{21} + a_6h_{22} + a_7h_{18}$
phase 2: $+\ a_4h_{18} + a_5h_{22} + a_6h_{21} + a_7h_{17}$
phase 3: $+\ a_4h_{19} + a_5h_{23} + a_6h_{20} + a_7h_{16}$

FIGURE 31C

Block A:
phase 0: $y_n = a_0h_0 + a_1h_4 + a_2h_8 + a_9h_{11}$
phase 1: $y_n = a_0h_1 + a_1h_5 + a_2h_9 + a_9h_{10}$
phase 2: $y_n = a_0h_2 + a_1h_6 + a_2h_{10} + a_9h_9$
phase 3: $y_n = a_0h_3 + a_1h_7 + a_2h_{11} + a_9h_8$ Block B:
phase 0: $+\ a_3h_{12} + a_8h_{15} + a_{10}h_7 + a_{11}h_3$
phase 1: $+\ a_3h_{13} + a_8h_{14} + a_{10}h_6 + a_{11}h_2$
phase 2: $+\ a_3h_{14} + a_8h_{13} + a_{10}h_5 + a_{11}h_1$
phase 3: $+\ a_3h_{15} + a_8h_{12} + a_{10}h_4 + a_{11}h_0$ Block C:
phase 0: $+\ a_4h_{16} + a_5h_{20} + a_6h_{23} + a_7h_{19}$
phase 1: $+\ a_4h_{17} + a_5h_{21} + a_6h_{22} + a_7h_{18}$
phase 2: $+\ a_4h_{18} + a_5h_{22} + a_6h_{21} + a_7h_{17}$
phase 3: $+\ a_4h_{19} + a_5h_{23} + a_6h_{20} + a_7h_{16}$

DIGITAL FILTER WITH STATE STORAGE

RELATED APPLICATIONS

This application claims benefit of U.S. Provisional Patent Application No. 60/245,229, filed Nov. 3, 2000 and entitled "FINITE IMPULSE RESPONSE FILTER".

BACKGROUND

1. Field of the Invention

This invention relates to digital signal processing.

2. Background Information

Digital signal processing techniques may be used to process signals at baseband, intermediate, and radio frequencies. In addition to their use in new applications, such techniques are also replacing analog processing techniques in existing applications such as signal filtering. The numerous advantages that a digital filter may possess over an analog counterpart include a lack of impedance matching problems, guaranteed stability and/or phase linearity, freedom from a change in response due to aging, and programmability and ease of alteration.

Digital filter s are implemented primarily as linear constant coefficient filters. Such filters may be broadly divided into two lasses: infinite-impulse-response (IIR) filters and finite impulse response (FIR) filters. By incorporating feedback, IIR filters require fewer taps to achieve the same performance. Such filters cause less delay and can be implemented with less hardware than FIR filters with similar characteristics. However, IIR filters are harder to design than FIR filters, generally have nonlinear phase characteristics, and may have stability problems as well.

In contrast to IIR filters, FIR filters are guaranteed to produce abounded output in response to a bounded input. Moreover, if the coefficients of a FIR filter are symmetric (or antisymmetric), then the filter will have a linear phase response. One basic FIR filter system is illustrated in FIG. 1. Shift register 20 receives an input signal (e.g. a series of digital values) and outputs an N-element input vector S10 to filter 40. In this example, a new input value is shifted into register 20 upon a predetermined transition of a clock signal from clock 30. Filter 40 contains a filter coefficient vector of length N, N multipliers, and an N-input adder. For each instance of input vector S10 (expressed as a series of values $X_0, X_1, X_2, \ldots, X_N$), filter 40 outputs a value y according to the expression $$y = \sum_{n=0}^{N-1} x_n h_n.$$

Further information on the theory and design of digital filters may be found in such documents as *Electronic Filter Design Handbook*, $2^{nd}$ ed., by A. B. Williams and F. J. Taylor, McGraw-Hill, New York, 1988; *Digital Filtering: an introduction*, E. P. Cunningham, Houghton Mifflin, Boston, 1992; and section XVI of *The Circuits and Filters Handbook*, ed. by W.-K. Chen, CRC Press, Boca Raton, Fla., 1995.

Lookup tables (LUTs) are used in various computing contexts to hold decision information that cannot easily be expressed mathematically. Two examples of information that may be stored in a LUT are (1) the mapping of IP addresses to aliases or to physical network locations, and (2) colormaps. Lookup tables have also been used in waveform generation applications to hold values that are frequently used but may be cumbersome to calculate, such as a mapping from a time index (x) into a trigonometric value (such as sin x or cos x).

A digital filter as shown in FIG. 1 is a calculation-intensive circuit. Because the set of possible input values to a digital filter is finite, the response of such a filter is completely deterministic and may be specified before runtime. However, it has not generally been feasible to use LUTs in digital filtering applications. In order to directly represent every possible output of an N-tap FIR filter which receives an input data stream M bits wide, a lookup table of size $2^{M \times N}$ would be required. For an 8-bit-wide input and a relatively short 16-tap filter, such a table would have to contain $2^{128}$ (or on the order of $10^{38}$) symbol storage spaces.

If the input data stream for the filter is only 1 bit wide (i.e. binary-valued), then the size of the lookup table reduces to $2^N$ symbol storage spaces. Even in this case, however, the size of the filter is severely limited by the resulting storage requirements: for example, a 16-tap filter would require $2^{16}$ symbol storage spaces (i.e. one megabit of storage area for every bit of the width of the output symbols). Where the performance of a longer filter is required or the application imposes severe circuit area and/or power constraints (e.g. as in a portable device for wireless communications), FIR implementation using lookup tables may not be feasible.

SUMMARY

A system for digital filtering according to one embodiment of the invention includes a digital filter that has a set of logic gates, a state storage, and a multiplexer. The set of logic gates is configured and arranged to receive an input vector and a phase count signal. The phase count signal may count at a rate that is a multiple of the rate of a clock associated with the input vector. The set of logic gates is configured and arranged to produce a state select vector based on at least a portion of the phase count signal and at least a portion of the input vector. For example, the set of logic gates may map the input vector to the state select vector according to a sequence select signal based on at least a portion of the phase count signal.

The state storage has two or more storage banks, each configured and arranged to receive the state select vector and to produce a state signal indicated by that vector. For example, the state storage (or each of the storage banks) may include one or more lookup tables having values based on components of a finite-impulse-response filter coefficient vector (such as a symmetric or antisymmetric filter coefficient vector). The state storage may also include combinatorial logic configured and arranged to produce a signal (such as a zero select signal) based on at least part of the state select vector.

The multiplexer is configured and arranged to receive the two or more state signals and to pass a selected state signal corresponding to a bank select signal. The bank select signal is based on the phase count signal and may also be based on at least a part of the input vector.

The digital filter may also include an inverter configured and arranged to produce an output signal based on the selected state signal and an invert signal. The invert signal is based on at least part of the input vector and may also be based on the phase count signal. Additionally, components of at least a portion of the state select vector may be based on the invert signal.

Such a system may include a shift register configured and arranged to produce the input vector and a phase counter configured and arranged to produce the phase count signal.

The system may also include additional digital filters, with one or more adders configured and arranged to produce a sum based on the selected state signals.

A method of digital filtering according to an embodiment of the invention includes receiving an input vector and a phase count signal and mapping the input vector to a state select vector according to the phase count signal. The method also includes inputting the state select vector to a state storage that includes two or more storage banks. From each of the storage banks, a state signal corresponding to the state select vector is received, and one from among the state signals is selected according to a bank select signal. As noted above, the bank select signal is based on the phase count signal and may also be based on at least a part of the input vector.

Additional embodiments of the invention and applications thereof are described and/or illustrated herein. For example, a system or method according to an embodiment of the invention may be applied to filter a binary data stream according to the 48-tap FIR filter shown in TABLE 1.

BRIEF DESCRIPTION OF THE DRAWINGS

FIG. 6A shows a block diagram of a digital filter 100 according to an embodiment of the invention.

FIG. 6B shows a block diagram of a system for digital filtering according to an embodiment of the invention.

FIG. 11A shows a block diagram of an implementation 114-1 of set of logic gates 110.

FIG. 11B shows a block diagram of an implementation 124c1 of storage bank 124c.

FIG. 30A shows a division of the reduction of FIG. 29B.

FIG. 30B shows another division of the reduction of FIG. 29B.

FIG. 31A shows a phase decomposition of a 48-tap FIR filter.

FIG. 31B shows a division of the decomposition of FIG. 29A.

FIG. 31C shows another division of the decomposition of FIG. 29A.

DETAILED DESCRIPTION

Figure 2:
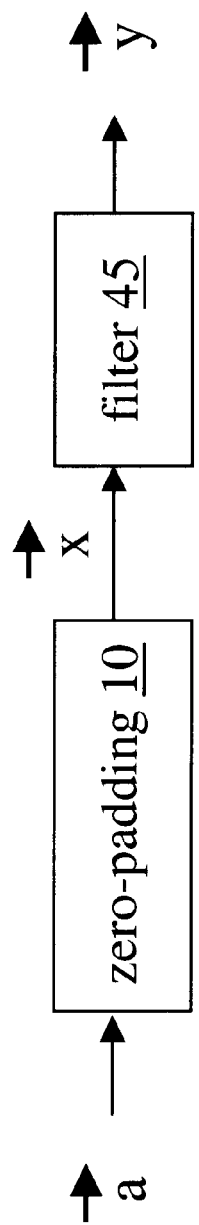
FIG. 2 shows an example of a data path for a pulse-shaping filter system.
Figure 3A:
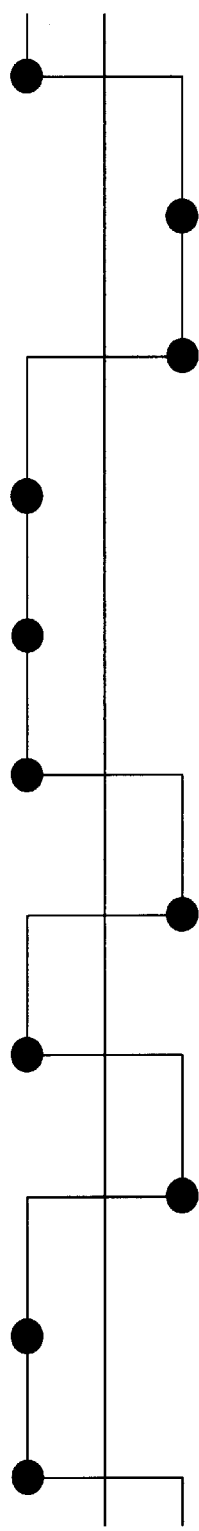
FIGS. 3A, 3B, and 3C illustrate signals $\vec{a}$, $\vec{x}$, $\vec{y}$ of FIG. 2, respectively.
Figure 3B:
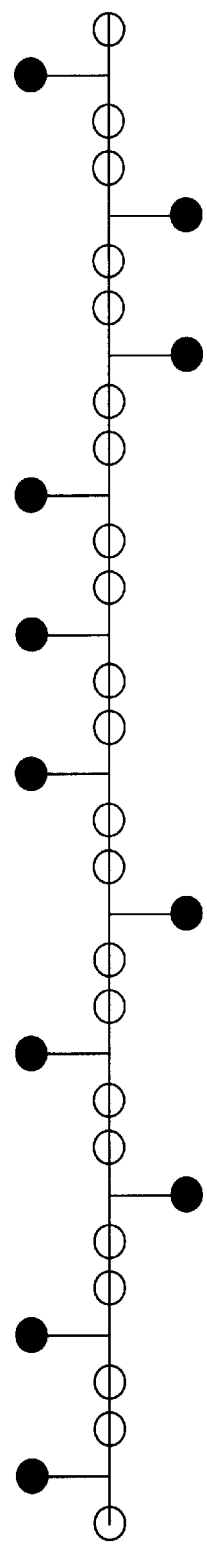
Figure 3C:
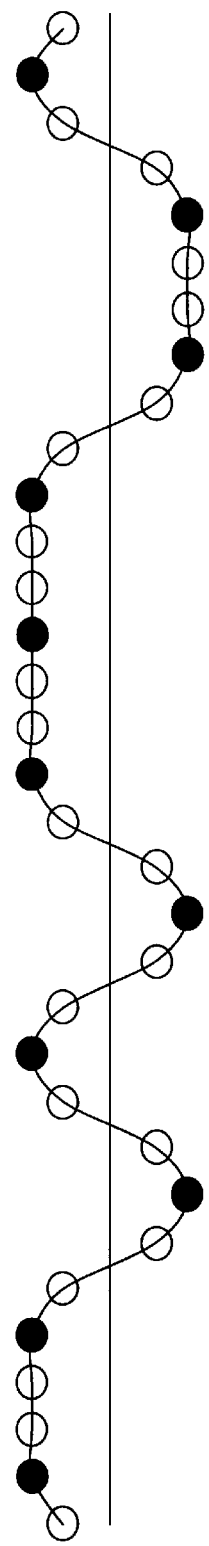

Digital filters are frequently used to modify the frequency characteristics of an input signal. One such application is to control the bandwidth of a baseband signal before transmission (e.g. over a radio-frequency (RF) channel). FIG. 2 shows one example of a data path for a pulse-shaping filter system that includes a zero-padding operation 10 and a FIR filter 45. FIGS. 3A, B, and C provide illustrations of signals $\vec{a}$ =[K ,$\alpha_0,\alpha_1,\alpha_2,\alpha_3$,K], $\vec{x}$, and $\vec{y}$, respectively.

In this non-limiting example, input signal $\vec{a}$ is binary-valued (±1), while output signal $\vec{y}$ is more than one bit wide. Zero-padding operation 10 produces upsampled signal $\vec{x}$ =[K ,$\alpha_0$,0,0,$\alpha_1$,0,0,$\alpha_2$,0,0,$\alpha_3$,0,0,K] by inserting (L−1) zero samples for each sample of signal $\vec{a}$ (in this example, upsampling factor L=3, and the zero samples are inserted after each data value). Filter 45 filters signal $\vec{x}$ to produce pulse-shaped signal $\vec{y}$. Coefficients for one particular example of a pulse-shaping filter are shown in TABLE 1 below; this 48-tap symmetric filter is specified in Table 6.1.3.1.10-1 of TIA/EIA Interim Standard IS-95-A (May 1995, Telecommunications Industry Association, Arlington, Va.) for a binary data stream upsampled by L=4.

TABLE 1

| k | h(k) | k | h(k) |
|---|---|---|---|
| 0, 47 | −0.025288315 | 12, 35 | 0.007874526 |
| 1, 46 | −0.034167931 | 13, 34 | 0.084368728 |
| 2, 45 | −0.035752323 | 14, 33 | 0.126869306 |
| 3, 44 | −0.016733702 | 15, 32 | 0.094528345 |
| 4, 43 | 0.021602514 | 16, 31 | −0.012839661 |
| 5, 42 | 0.064938487 | 17, 30 | −0.143477028 |
| 6, 41 | 0.091002137 | 18, 29 | −0.211829088 |
| 7, 40 | 0.081894974 | 19, 28 | −0.140513128 |
| 8, 39 | 0.037071157 | 20, 27 | 0.094601918 |
| 9, 38 | −0.021998074 | 21, 26 | 0.441387140 |
| 10, 37 | −0.060716277 | 22, 25 | 0.785875640 |
| 11, 36 | −0.051178658 | 23, 24 | 1 |

In an application where the N-element filter coefficient vector is specified for a zero-padded input stream, the number of nonzero terms that contribute to each output value is limited by N/L rather than N (where L is the upsampling factor and N is the length of the filter coefficient vector). Expressions for each of the L output values $y_i$ that are produced for one instance of input vector $[a_0, a_1, a_2, a_3]$ follow, each expression including N/L possibly nonzero terms (in this non-limiting example, L=4 and N=16):

$$y_0 = a_0 h_0 + a_1 h_4 + a_2 h_8 + a_3 h_{12}; \quad (1)$$

$$y_1 = a_0 h_1 + a_1 h_5 + a_2 h_9 + a_3 h_{13}; \quad (2)$$

$$y_2 = a_0 h_2 + a_1 h_6 + a_2 h_{10} + a_3 h_{14}; \quad (3)$$

$$y_3 = a_0 h_3 + a_1 h_7 + a_2 h_{11} + a_3 h_{15}. \quad (4)$$

Figure 4A:
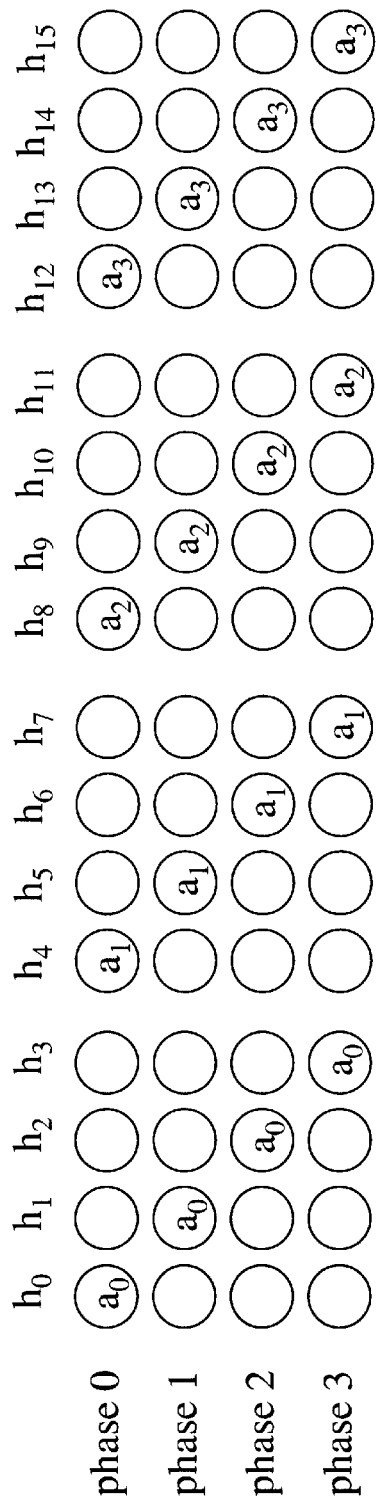
FIG. 4A shows a phase decomposition of a FIR filter.

These expressions are illustrated in FIG. 4A, which demonstrates that the operations of such a filter may be modeled as separate applications of the input vector to L nonoverlapping cosets (or phases) of the filter coefficients.

Figure 1:
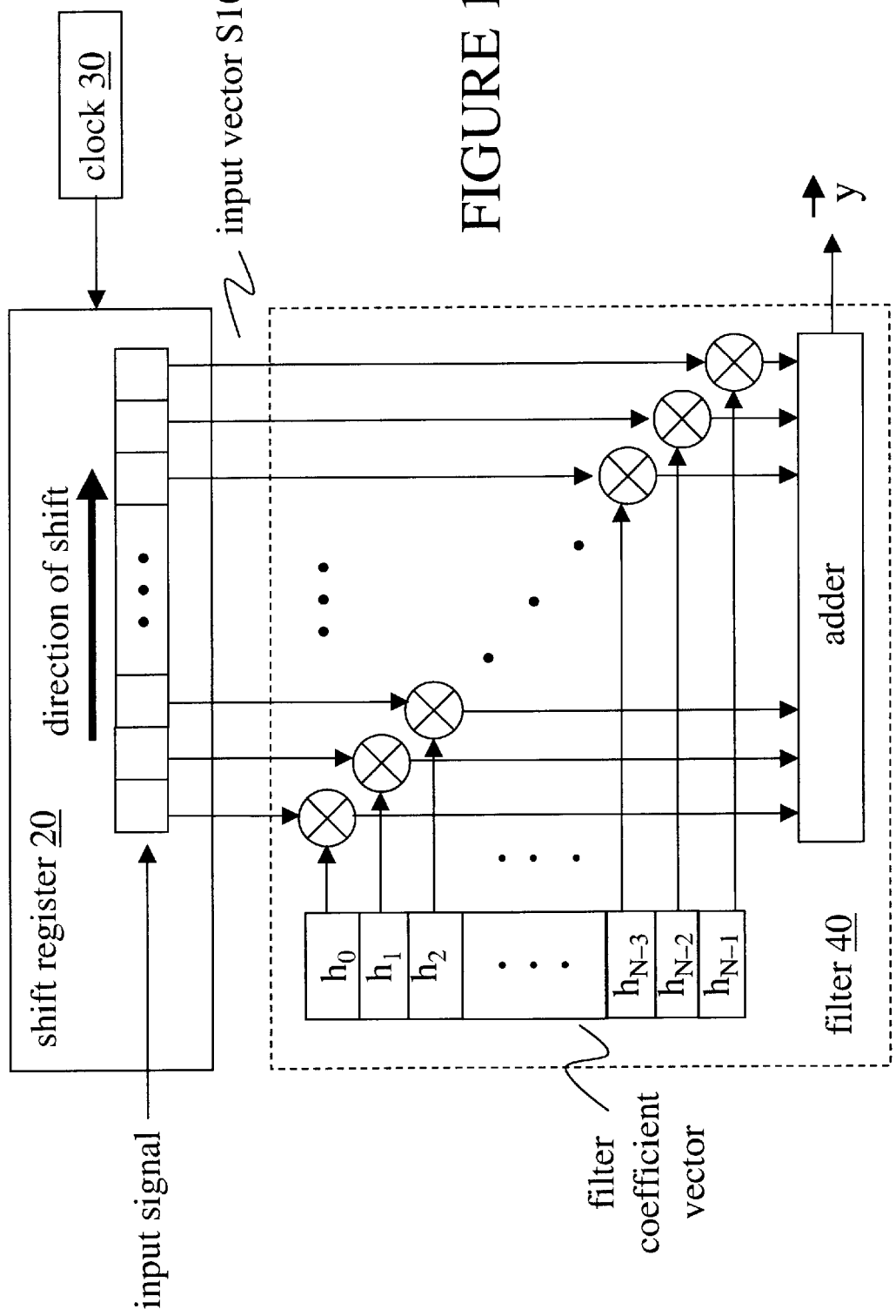
FIG. 1 is a block diagram of a basic FIR filter system.

The zero-padding and filtering operations shown in FIG. 2 may also be combined into a single filtering operation. In one possible implementation of these principles, the values of the N terms of expressions (1)–(4) are precalculated and stored for each possible input vector. These values are then retrieved at runtime (according to the phase number and the particular instance of the input vector) as output values of the filter. In such case, the total number of states to be stored may be reduced from $P^N$ ($2^N$ for binary input) to $L \times P^{N/L}$ ($L \times 2^{N/L}$ for binary input), where P is the number of possible states for each component of the input vector, and the filter is clocked at a rate at least L times greater than the clock associated with the input vector (e.g. clock 30 in FIG. 1). In the example of FIG. 4A, the total number of states to be stored may be reduced from $2^{16}$ to $2^6$ for binary input (with the filter output values being arbitrarily wide).

Figure 4B:
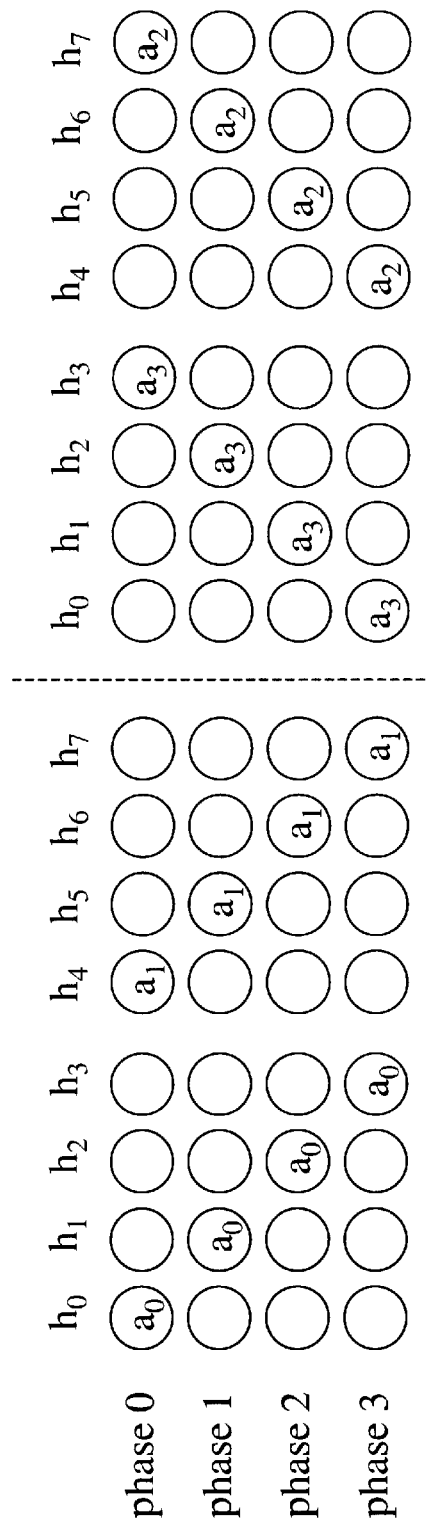
FIG. 4B shows a retrieval of two values from a reduced storage for each filter output value.

In a case where the filter coefficient vector is symmetric ($h_i = h_{(N−i−1)}$), the maximum required storage capacity may be reduced further (i.e. by a factor of 2). FIG. 4B illustrates how two values may be retrieved from the reduced storage at runtime (e.g. in successive filter clock periods), each according to the phase number and a respective half of the input vector. These two values are then added together to produce a filter output value. In this case, the filter is clocked at a rate at least 2L times greater than the clock associated with the input vector. Additionally, the two retrieved values to be added may be many bits wide, and an adder having considerable complexity (and possibly a considerable delay) may be required to perform the summing operation.

Figure 5A:
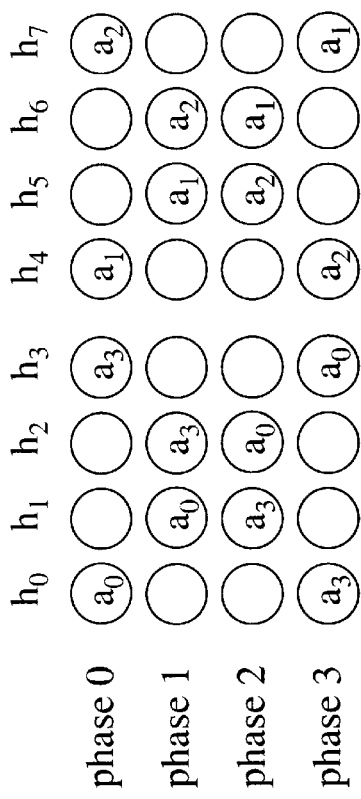
FIGS. 5A, 5B, and 5C illustrate an approach to reducing storage according to an embodiment of the invention.
Figure 5B:
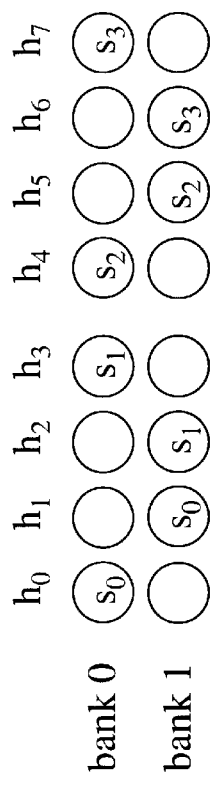
Figure 5C:
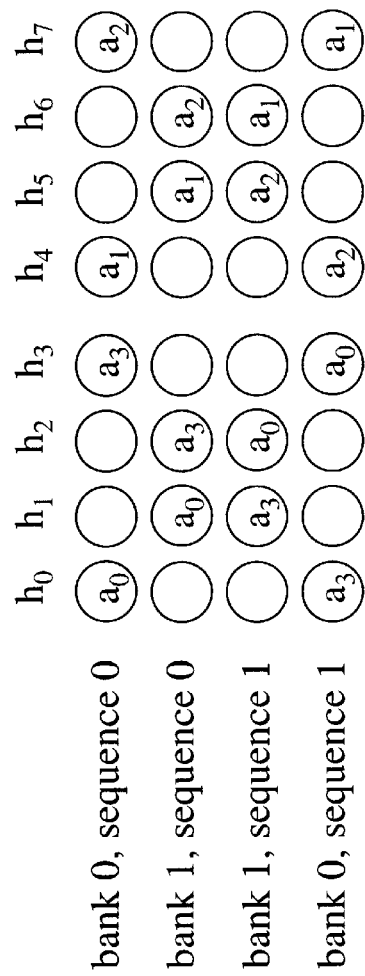

FIGS. 5A, 5B, and 5C illustrate an alternative approach to reducing the required storage capacity in a case where the filter coefficient vector is symmetric.

FIG. 5A shows how the symmetry of the coefficients can be exploited to allow the entire input vector to be applied as an index to the reduced storage for each phase. In FIG. 5B, the L phases are reduced to L/2 banks indexed by a sequence vector having two states. In the first state, the input vector is mapped to the sequence $\{a_0, a_3, a_1, a_2\}$. In the second state, the input vector is mapped to the sequence $\{a_3, a_0, a_2, a_1\}$. FIG. 5C demonstrates how each desired filter output may be retrieved in a single indexing operation according to a bank select signal and a mapping of the input vector to a selected sequence.

FIG. 6A shows a block diagram of a digital filter 100 according to an embodiment of the invention. A set of logic gates 110 receives the input vector S10 and a phase count signal S20. In an exemplary implementation, phase count signal S20 is clocked at a rate L times that of the clock associated with input vector S10, such that phase count signal S20 counts from 0 to (L−1) for each instance of the input vector. Based on at least a portion of phase count signal S20, set 110 selects a sequence and maps the input vector to a state select vector S30 according to the selected sequence. Set 110 also produces a bank select signal S40 based on phase count signal S20 (or a portion thereof).

State storage 120 includes two or more storage banks 120$i$, each receiving state select vector S30. Each storage bank 120$i$ may include combinatorial logic and/or a lookup table having stored values. In some implementations, two or more of storage banks 120$i$ may include different portions of a single lookup table.

Each storage bank 120$i$ outputs a state signal S60$i$. Multiplexer 130 receives the state signals S60$i$ and passes one among them as selected state signal S50 according to bank select signal S40.

In one binary-input implementation of the example illustrated in FIG. 5C, state storage 120 has two storage banks 120$a$ (bank 0) and 120$b$ (bank 1). In this implementation, bank 0 stores the sixteen values represented by the expression ($\pm h_0 \pm h_3 \pm h_4 \pm h_7$), while bank 1 stores the sixteen values represented by the expression ($\pm h_1 \pm h_2 \pm h_5 \pm h_6$).

FIG. 6B shows a block diagram of a system for digital filtering according to an embodiment of the invention. Shift register 20 receives an input signal S5 and a clock signal from clock 30 and produces an N/L-component input vector S10. Filter 100 receives input vector S10 and phase select signal S20 (from phase counter 300) and produces selected state signal S50. As noted above, filter 100 produces L output values for each instance of input vector S10.

Figure 7:
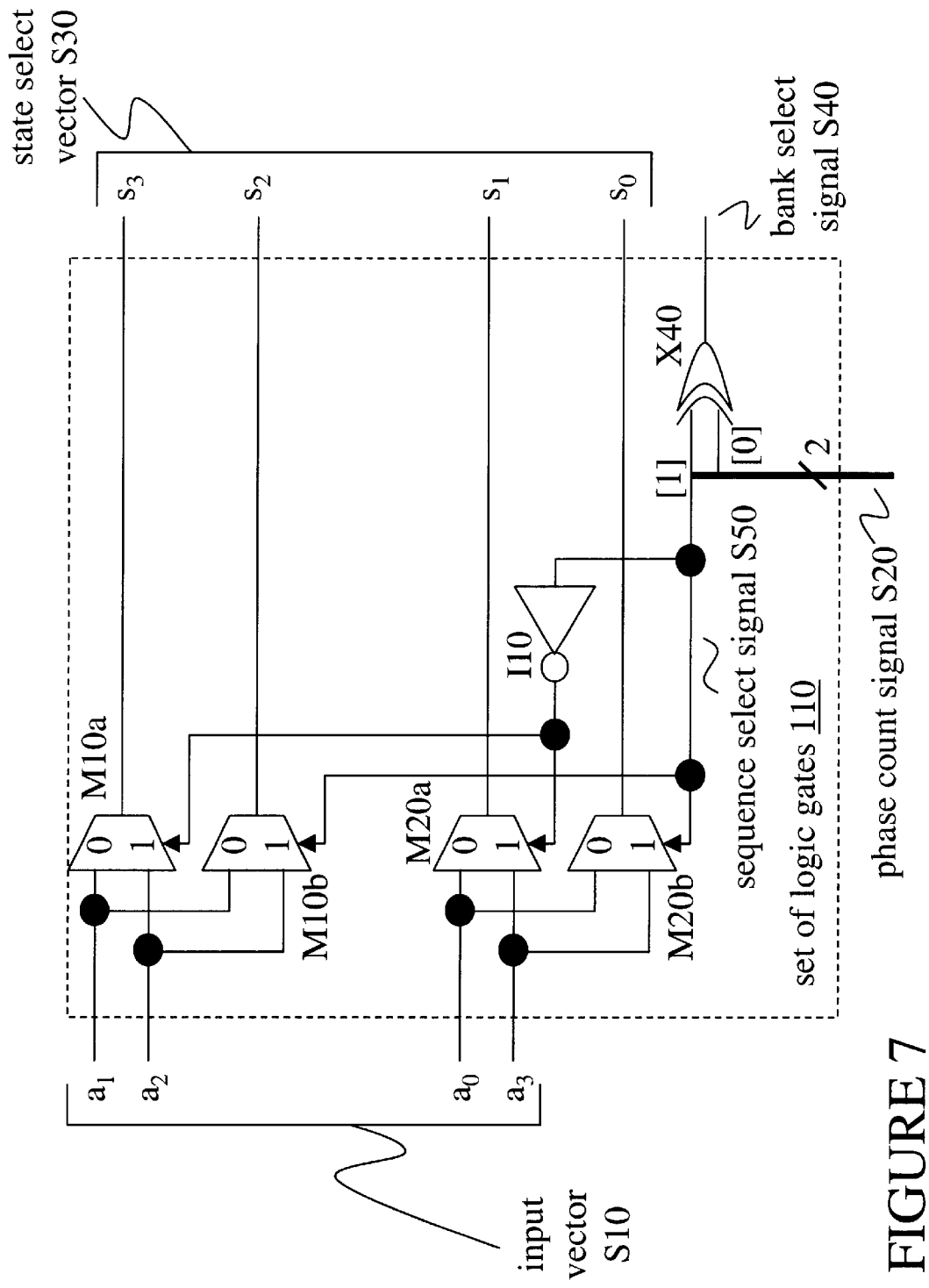
FIG. 7 shows a block diagram of an exemplary implementation of set of logic gates 110.

FIG. 7 shows a block diagram of an exemplary implementation of set of logic gates 110 for a type 2 FIR filter (i.e. having a symmetric filter coefficient vector of even length). In this implementation, multiplexer pairs M10 and M20 map input vector S10 to state select signal S30, switching between the two sequences according to sequence select signal S50 (here, the high bit of phase count signal S20) and inverter I10. XOR gate X40 receives phase count signal S20 and produces bank select signal S40, which controls multiplexer 130 to select between the state signals S60 produced by storage banks 120$a$, 120$b$ (banks 0, 1) of state storage 120 as discussed above.

Figure 8:
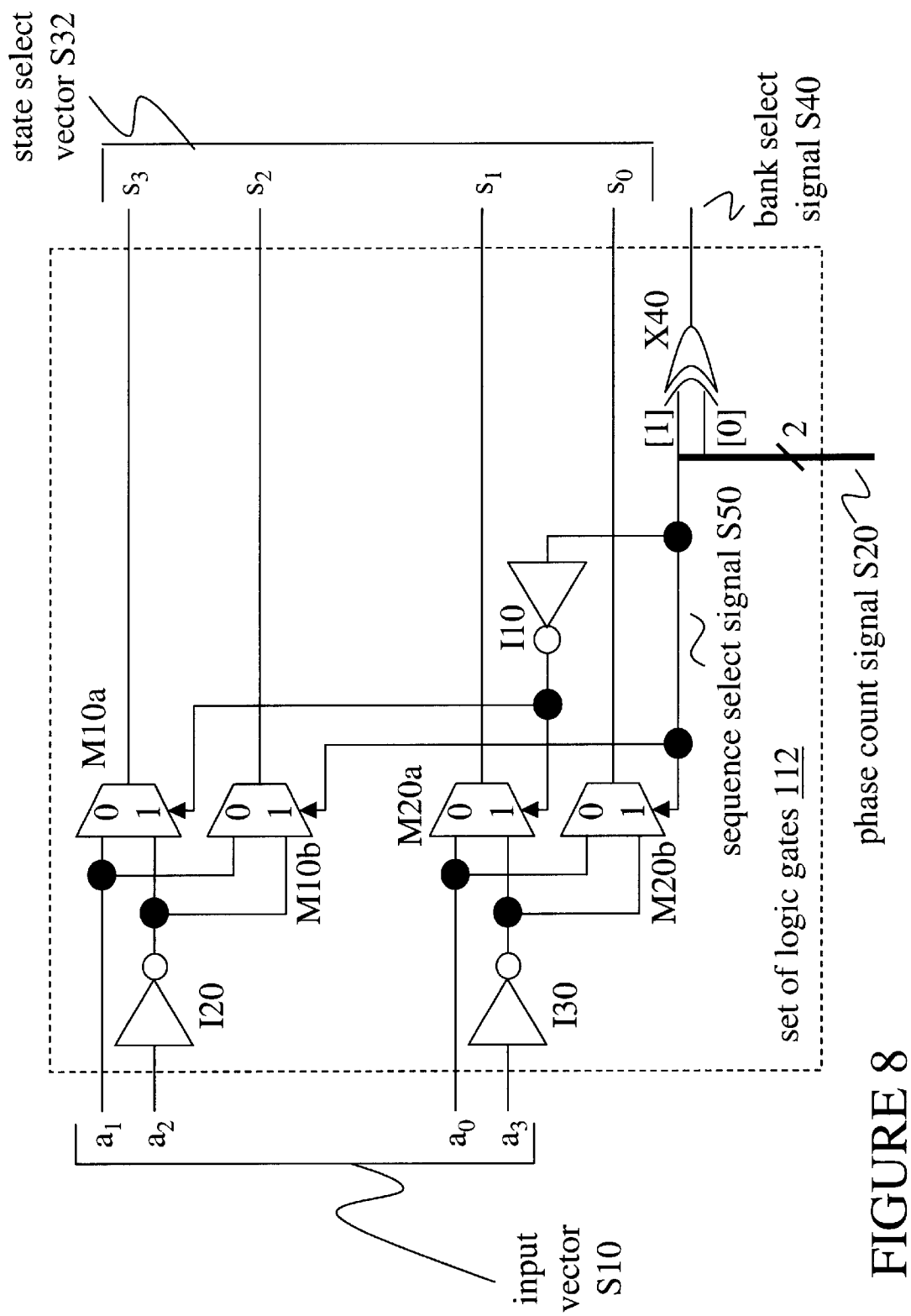
FIG. 8 shows a block diagram of an exemplary implementation 112 of set of logic gates 110.

FIG. 8 shows a block diagram of an exemplary implementation 112 of set of logic gates 110 for a type 4 FIR filter (i.e. having an antisymmetric filter coefficient vector of even length). In this implementation, inverters 120 and 130 invert the components in the latter half of input vector S10 (here, $a_2$ and $a_3$).

A filter according to an embodiment of the invention as shown in FIG. 6 is not limited to implementations in which input vector S10 has binary-valued components. For example, implementations of sets of logic gates 110 and 112 as shown in FIGS. 7 and 8 may also be used in applications where components of input vector S10 have more than one bit. In such cases, multiplexer pairs M10, M20 may be configured to select between multi-bit input values (in response to a binary control signal), and inverters 120, 130 may be configured to invert multi-bit data values.

Sets 110 (and 112) as shown in FIGS. 7 and 8 may be used in implementing filter coefficient vectors of arbitrary even length N by adding additional multiplexer pairs (and one or more corresponding inverters) as appropriate. As noted above, such filters may be decomposed into (and state storage 120 may be implemented to include) L/2 banks.

Figure 9A:
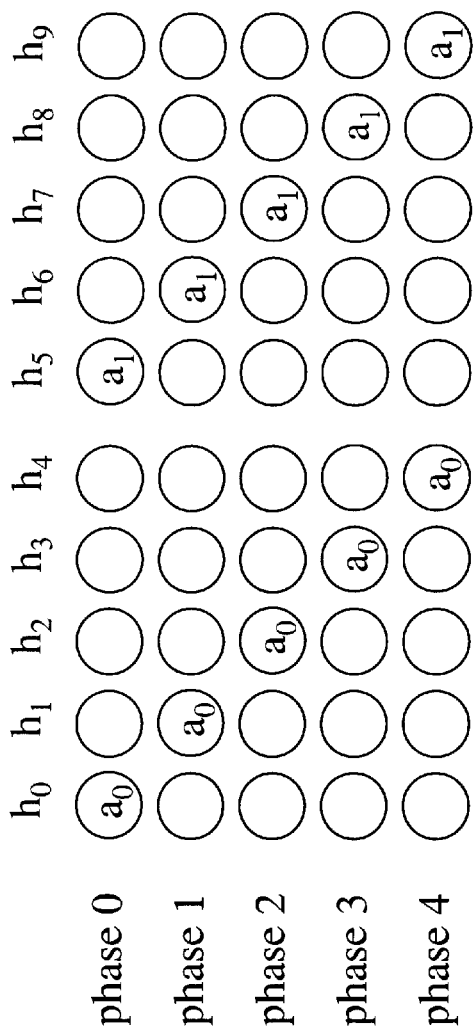
FIG. 9A shows a phase decomposition of a type 2 FIR filter.
Figure 9B:
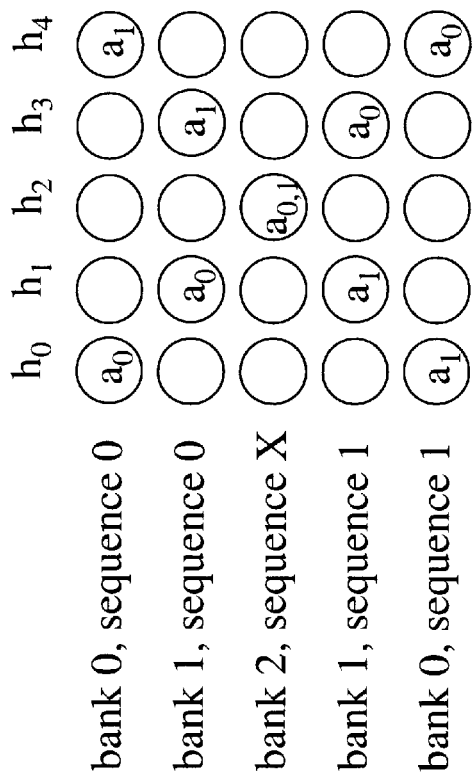
FIG. 9B illustrates a reduction of the decomposition of FIG. 9A.

FIG. 9A illustrates an example of a phase decomposition of a Type 2 FIR filter in which L is odd and N/L is even (here, L=5, N=10, and N/L=2). As shown in FIG. 9B, such a case (having L phases) may be condensed to ceil(L/2) banks (ceil(x) denoting the smallest integer not less than x), where the highest numbered bank has only one sequence (sequence number X indicating 'don't care').

Figure 10:
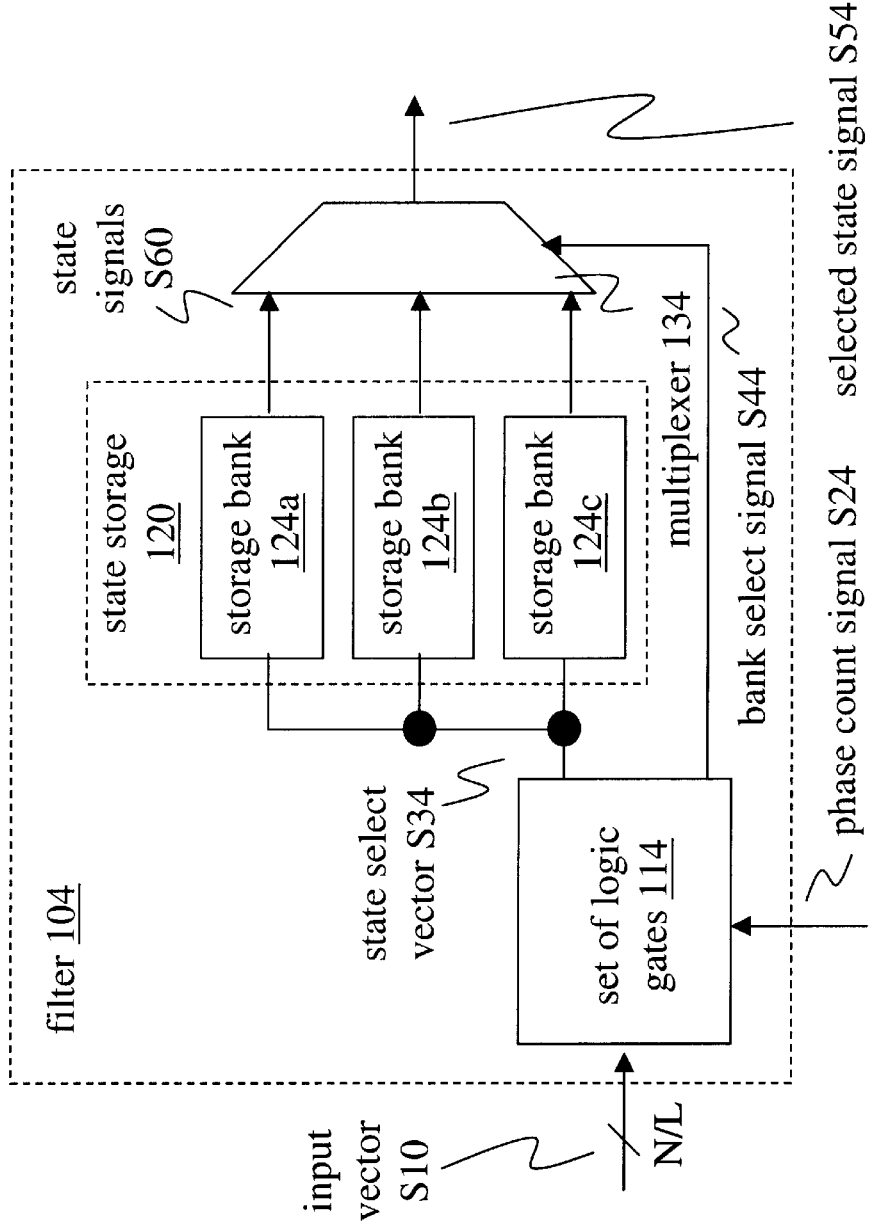
FIG. 10 shows a block diagram of an implementation 104 of a filter 100 according to an embodiment of the invention.

FIG. 10 shows a block diagram of an implementation 104 of a filter 100 according to an embodiment of the invention for a case where L is odd and N/L is even (e.g. as shown in FIG. 9B). In this implementation, state storage 120 include ceil(L/2) banks, each receiving state select vector S34, and multiplexer 134 selects from among the ceil(L/2) state signals S60i according to bank select signal S44.

FIG. 11A shows a block diagram of an implementation 114-1 of set of logic gates 110 suitable for the particular case illustrated in FIG. 9B. In this implementation, XOR gate X60 receives the two high bits of phase count signal S24 (which counts from 0 to (L−1)=4) and produces sequence select signal S54, and the two low bits of phase count signal S24 serve as bank select signal S44.

As noted in FIG. 9B, the sequence in which $a_0$ and $a_1$ are mapped to state select signal S34 is irrelevant to bank 2, as both input values correspond to the same filter coefficient value. Another consequence of this correspondence is that if the value of $a_0$ is the inverse of the value of $a_1$, the filter output is zero. In fact, by including logic to produce zero and inverted values at runtime, bank 2 may be implemented in this case with only one stored value.

FIG. 11B shows a block diagram of an implementation 124c1 of storage bank 124c for the binary input case. XOR gate X70 receives state select vector S34. Via zero select signal S70-1, XOR gate S70 causes multiplexer M40 to output a zero value if the two components of state select vector differ. Value storage 210-1 stores only one value, which is received by XOR gate X80. If invert signal S80-1 (either component of state select vector S34) is high, the stored value is inverted. XOR gate X80 may be implemented to receive one multi-bit value (the stored value) and one binary value (invert signal S80-1). Depending upon the mapping between input and output values in the particular implementation, invert signal S80-1 may be inverted before being inputted to XOR gate X80.

Figure 12:
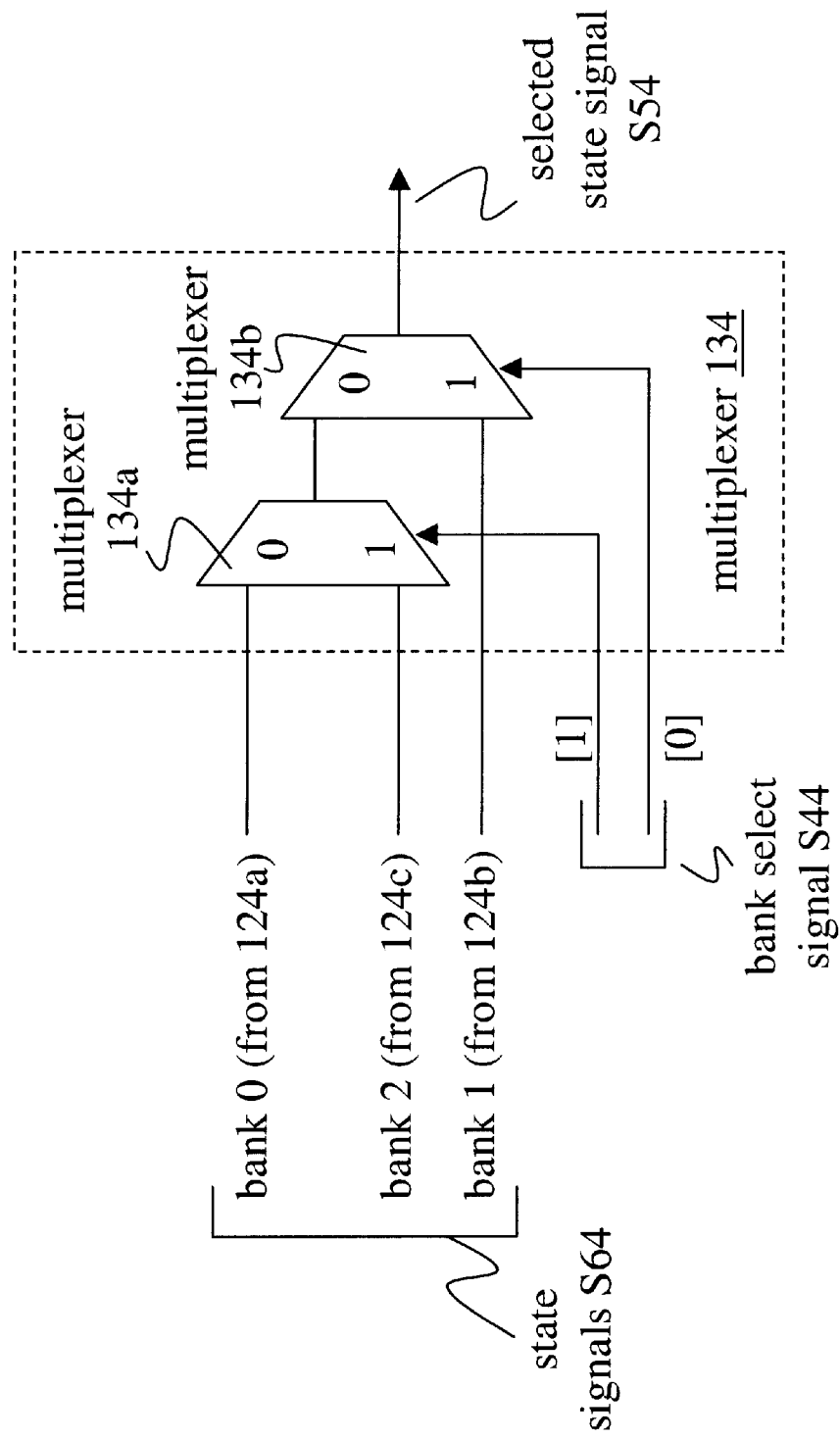
FIG. 12 shows a block diagram of multiplexer 134.

FIG. 12 shows a block diagram of multiplexer 134 suitable for use in the implementation 104 of filter 100 shown in FIG. 10. Multiplexer 134a selects between the state signals S64 of bank 0 and bank 2 according to the high bit of bank select signal S44, and multiplexer 134b selects between the state signal S64 of bank 1 and the output of multiplexer 134a according to the low bit of bank select signal S44.

Figure 13A:
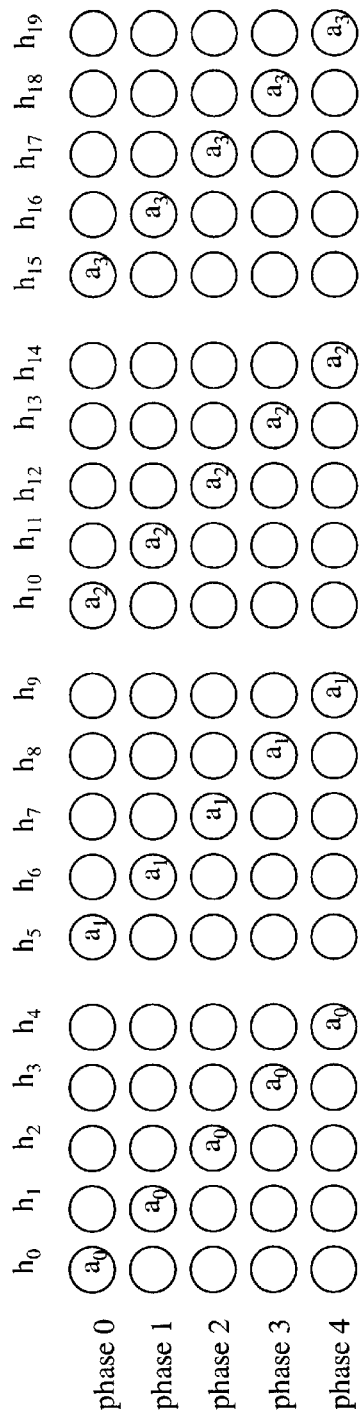
FIG. 13A shows a phase decomposition of a type 2 FIR filter.
Figure 13B:
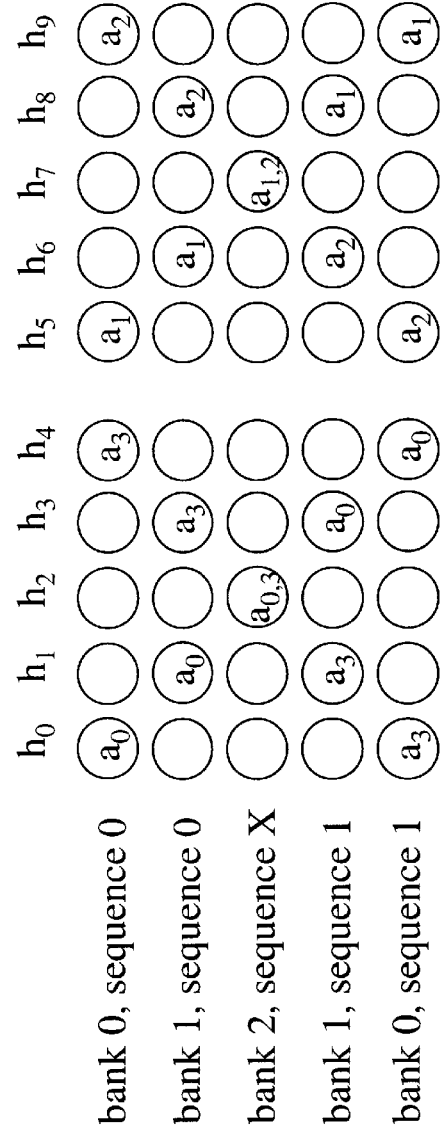
FIG. 13B illustrates a reduction of the decomposition of FIG. 13A.

FIG. 13A illustrates another example of a phase decomposition of a Type 2 FIR filter in which L is odd and N/L is even (here, L=5, N=20, and N/L=4). FIG. 13B shows how the L phases may be condensed to ceil(L/2) banks.

Figure 14:
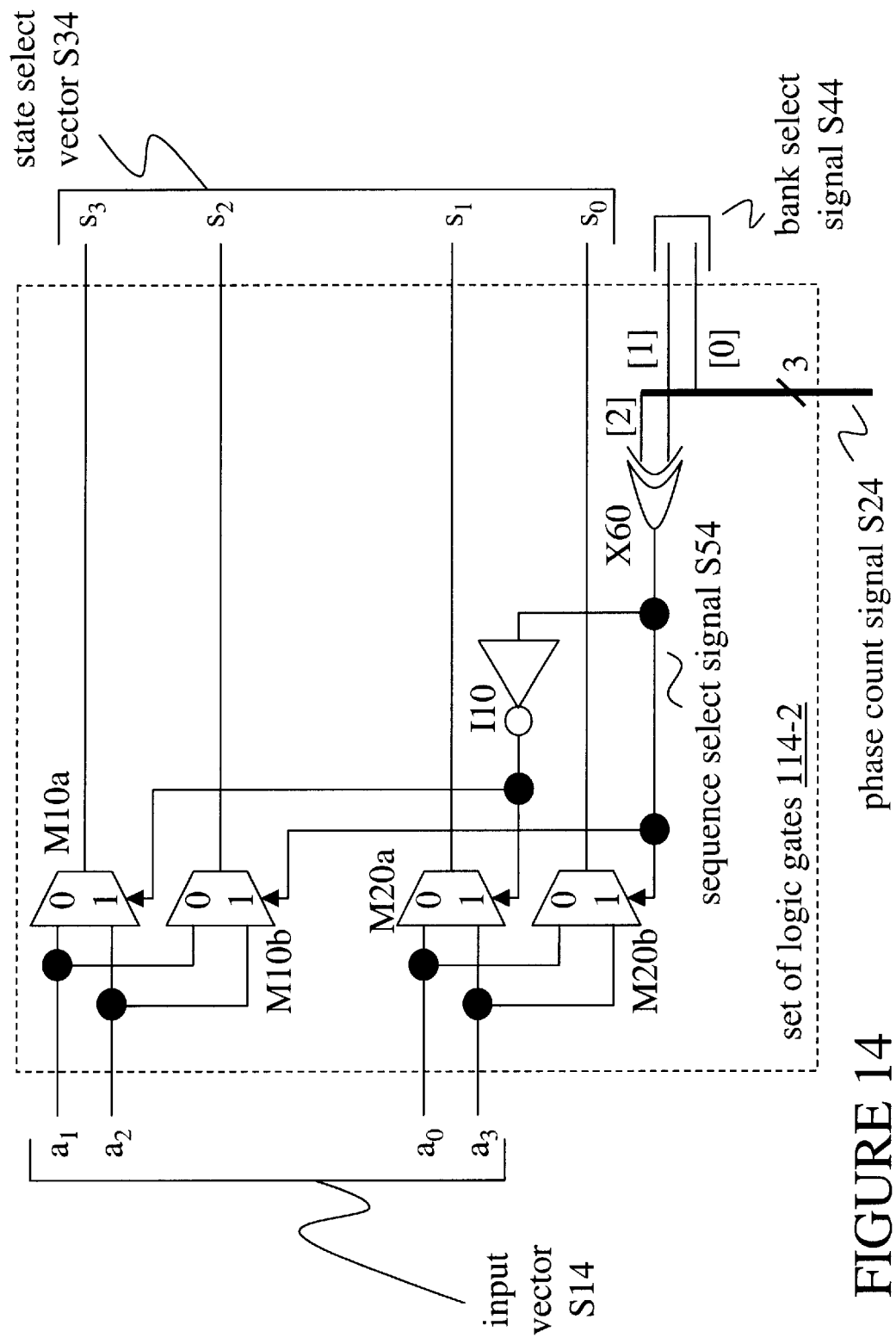
FIG. 14 shows a block diagram of an implementation 114-2 of set of logic gates 110.

FIG. 14 shows a block diagram of an implementation 114-2 of set of logic gates 110 suitable for the case illustrated in FIG. 13B. Multiplexer pairs M10 and M20 map input vector S14 to state select vector S34 according to sequence select signal S54 and its inverse. Set 114-2 may be used in implementing filter coefficient vectors of arbitrary even length N by adding additional multiplexer pairs (and one or more corresponding inverters) as appropriate.

Figure 15:
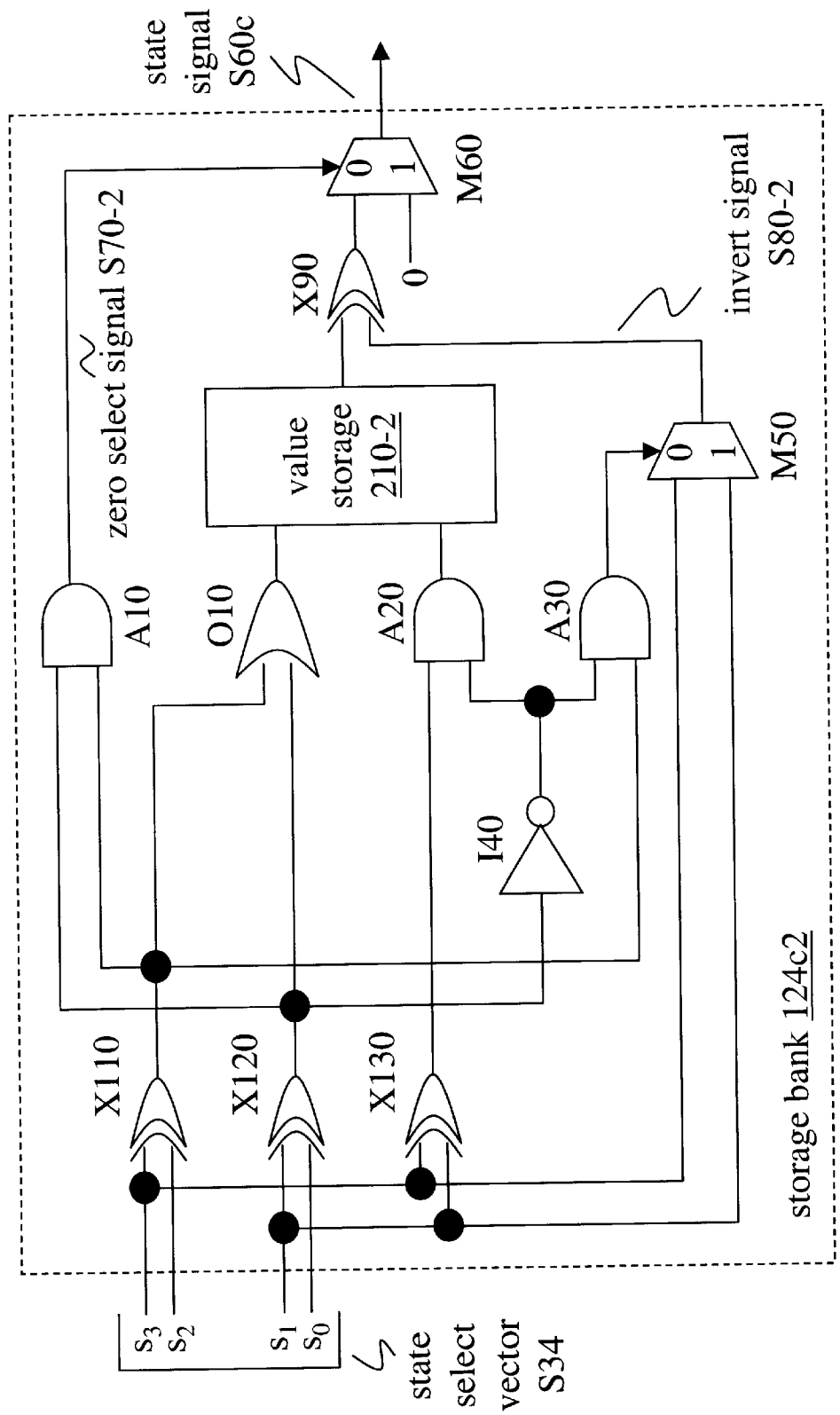
FIG. 15 shows a block diagram of an implementation 124c2 of storage bank 124c.

FIG. 15 shows a block diagram of an implementation 124c2 of storage bank 124c suitable for the case illustrated in FIG. 13B. In this case, value storage 210-2 stores only four values. Via a collection of logic gates (XOR gates X110, X120, X130; AND gates A10, A20, A30; OR gate O10; and inverter I40) and multiplexer M50, state select vector S34 is processed to select the appropriate value from value storage 210-2 and to produce zero select signal S70-2 and invert signal S80-2. Other collections of logic gates may be used, and Boolean expression minimization techniques (such as Karnaugh maps) may be used to produce such other collections and/or to extend implementation 124c2 to state select vectors having more components while minimizing the size of value storage 210. As with XOR gate X80 described above, XOR gate X90 may be implemented to receive one multi-bit value (the selected stored value) and one binary value (invert signal S80-2).

As discussed with reference to FIG. 8, sets of logic gates 114-1 and 114-2 may be extended to apply to the antisymmetric case by inverting the components in the latter half of input vector S10.

Figure 16A:
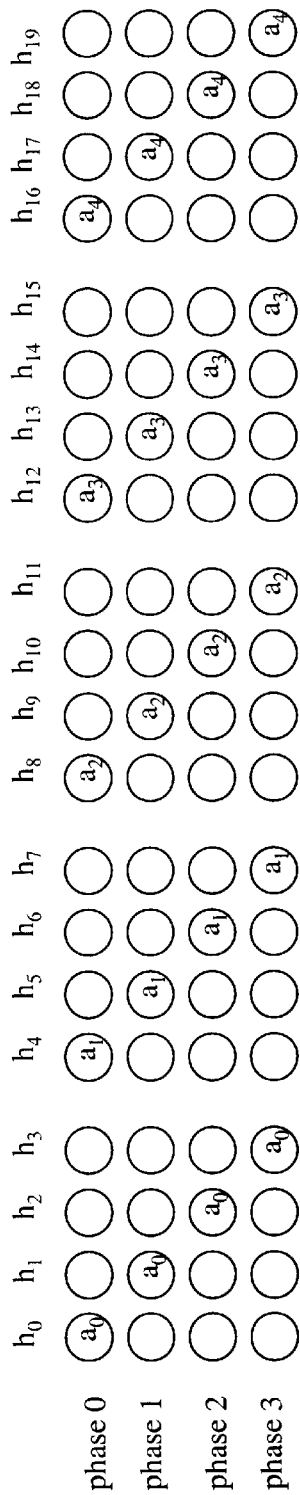
FIG. 16A shows a phase decomposition of a type 2 FIR filter.
Figure 16B:
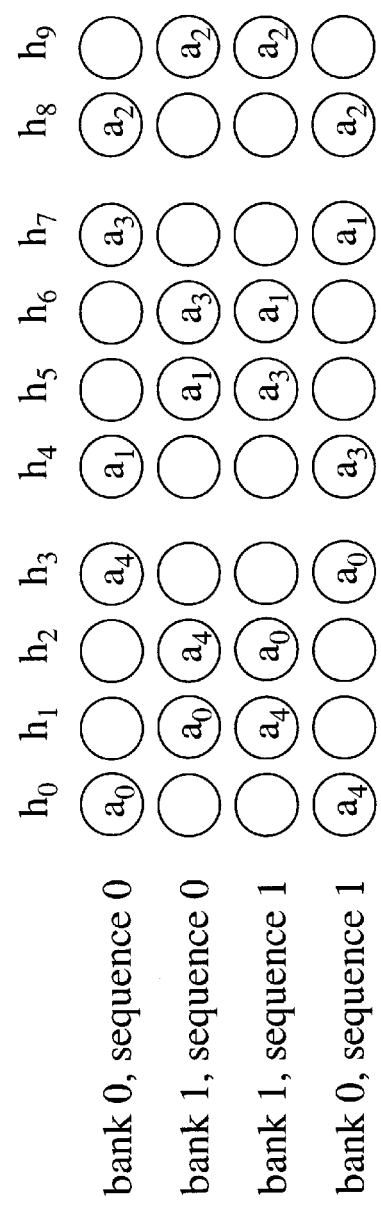
FIG. 16B illustrates a reduction of the decomposition of FIG. 16A.

FIG. 16A illustrates an example of a phase decomposition of a type 2 FIR filter in which L is even and N/L is odd (here, L=4, N=20, and N/L=5). FIG. 16B shows how the L phases may be condensed to L/2 banks.

Figure 17:
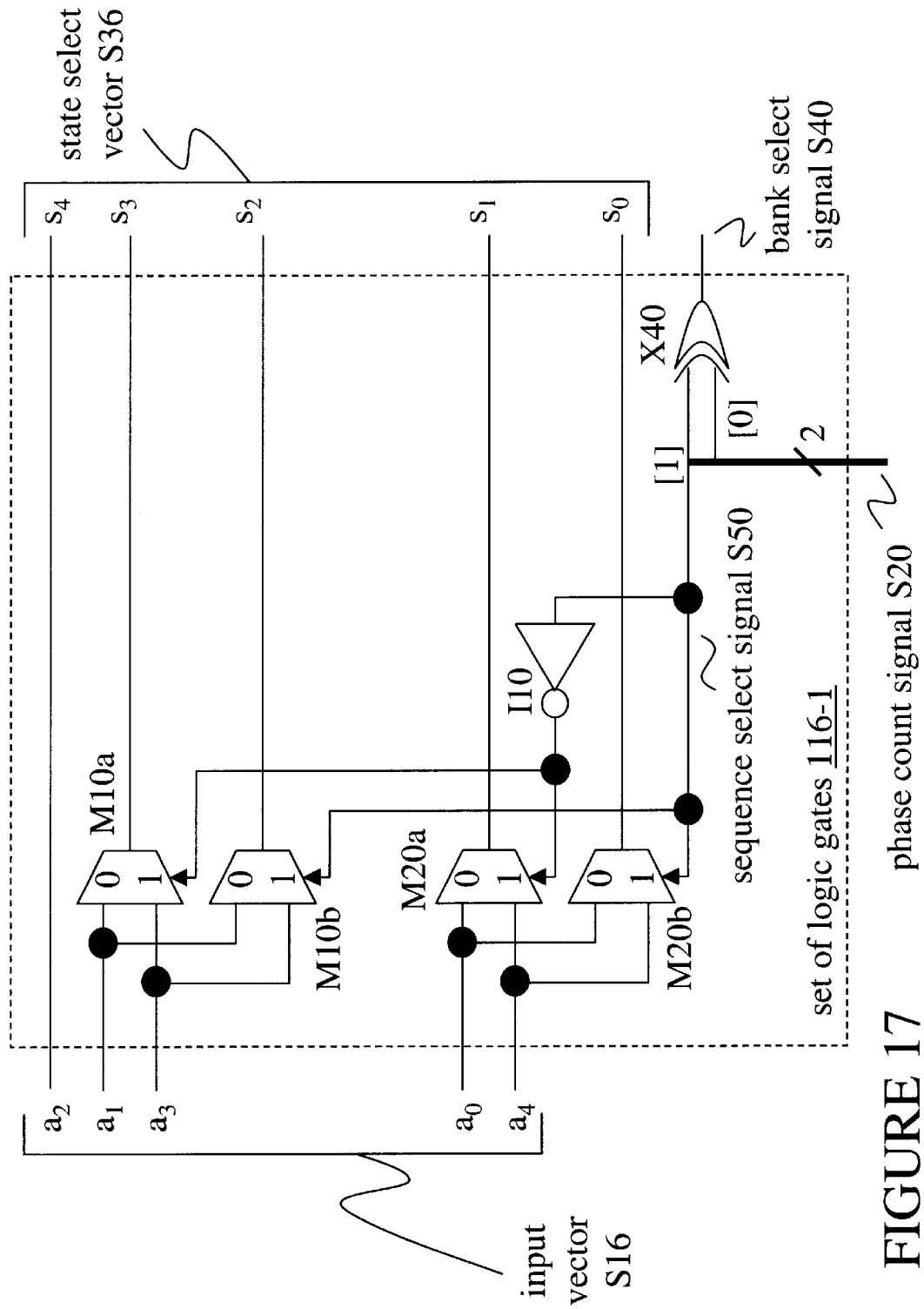
FIG. 17 shows a block diagram of an implementation 116-1 of set of logic gates 110.

FIG. 17 shows a block diagram of an implementation 116-1 of set of logic gates 110 suitable for the case illustrated in FIG. 16B. As the middle component of input vector S16 (here, $a_2$) shares filter coefficients with no other component, this value may pass through to the same component of state select vector S36 for all sequences.

Figure 18:
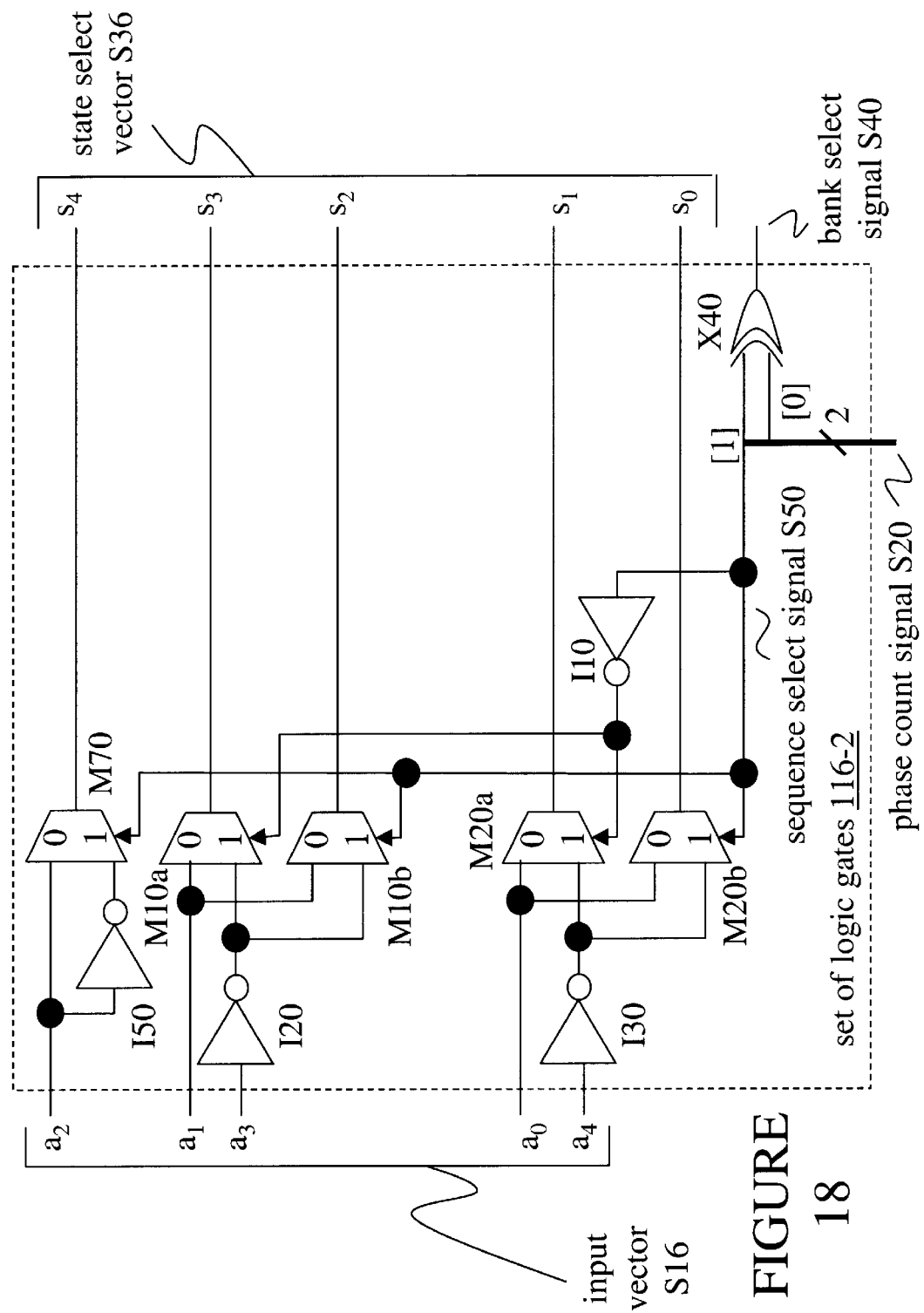
FIG. 18 shows a block diagram of an implementation 116-2 of set of logic gates 110.

FIG. 18 shows a block diagram of an implementation 116-2 of set of logic gates 110 suitable for a case as illustrated in FIG. 16B in which the filter coefficient is antisymmetric. Multiplexer M70 selects between the middle component of input vector S16 and its inverse (as produced by inverter 150) according to sequence select signal S50. In applications where components of input vector S16 have more than one bit, multiplexer M70 may be configured to select between multi-bit input values (in response to a binary control signal), and inverter I50 may be configured to invert a multi-bit data value.

Sets of logic gates 116-1 and 116-2 may be used in implementing filter coefficient vectors of arbitrary even length N by adding additional multiplexer pairs (and one or more corresponding inverters) as appropriate. As noted above, such filters may be decomposed into (and state storage may be implemented to include) ceil(L/2) banks.

Figure 19A:
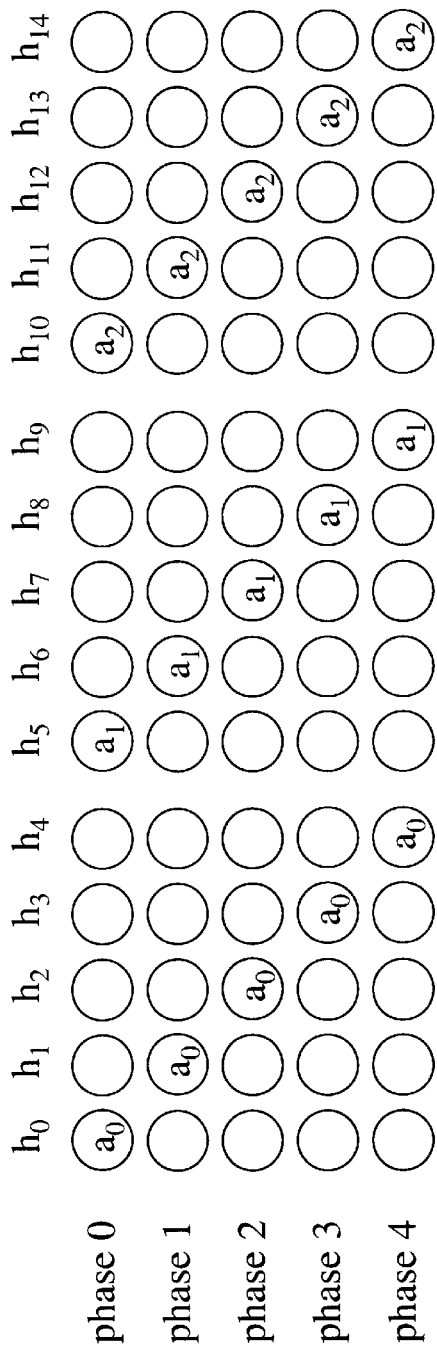
FIG. 19A shows a phase decomposition of a type 1 FIR filter.
Figure 19B:
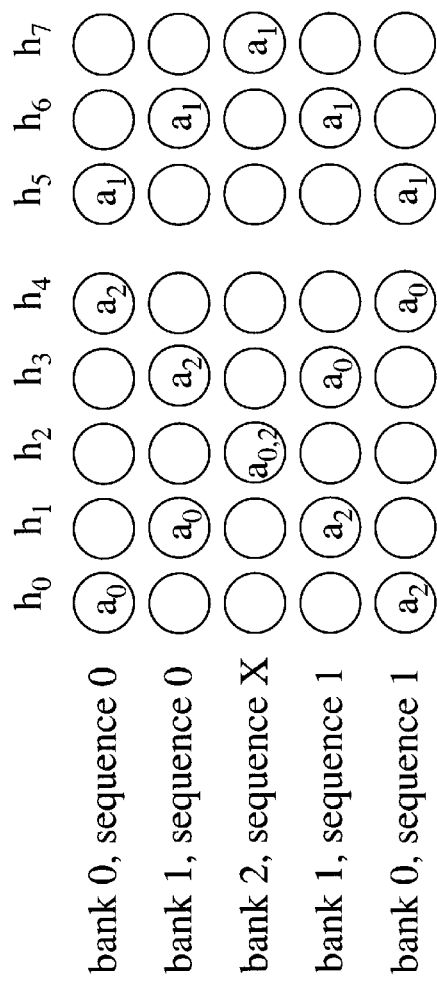
FIG. 19B illustrates a reduction of the decomposition of FIG. 19A.

FIG. 19A illustrates an example of a phase decomposition of a type 1 FIR filter (i.e. having a symmetric filter coefficient of odd length). In such case, both L and N/L are odd (here, L=5, N=15, and N/L=3). FIG. 19B shows how the L phases may be condensed to ceil(L/2) banks.

Figure 20:
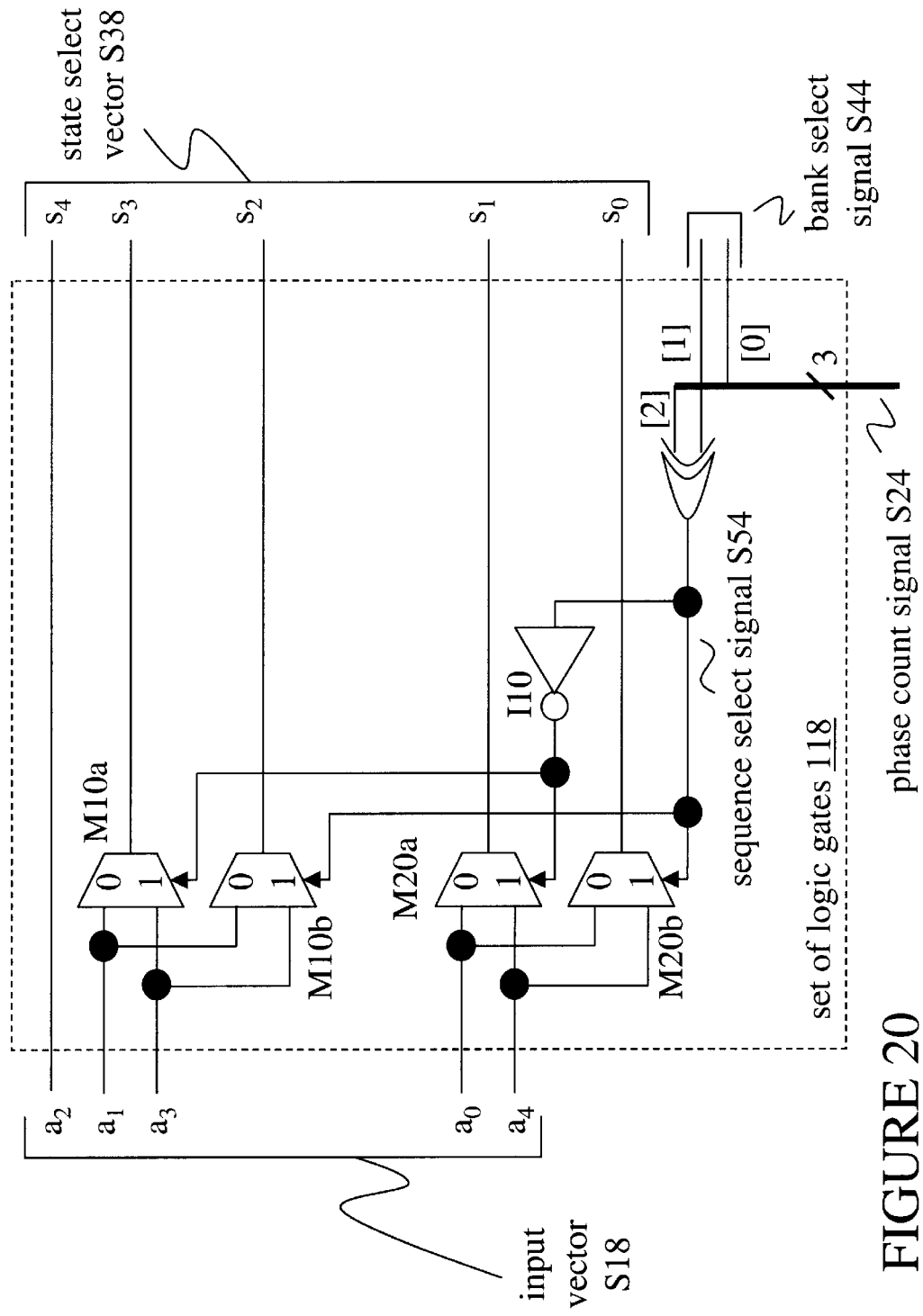
FIG. 20 shows a block diagram of an implementation 118 of set of logic gates 110.

FIG. 20 shows a block diagram of an implementation 118 of set of logic gates 110 suitable for a case as illustrated in FIG. 19B. Implementation 118 may be applied to cases of an antisymmetric filter coefficient vector (type 3) and/or components of input vector S18 having more than one bit by extension as described herein. Additionally, set of logic gates 118 may be used in implementing filter coefficient vectors of arbitrary odd length N by adding additional multiplexer pairs (and one or more corresponding inverters) as appropriate.

Figure 21:
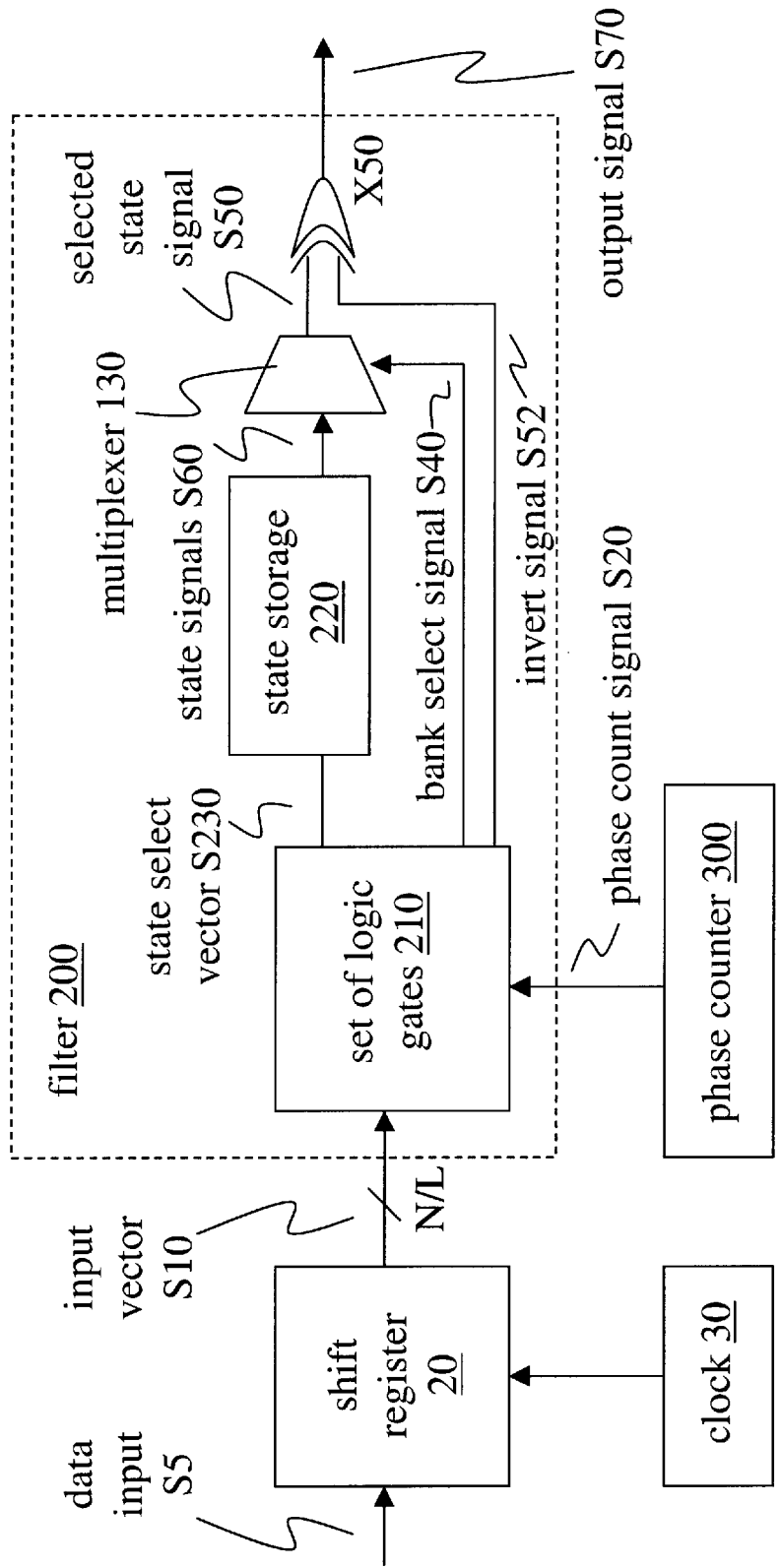
FIG. 21 shows a block diagram of an implementation 200 of a digital filter according to another embodiment of the invention.

FIGS. 11B and 15 above demonstrate how the number of stored values in a storage bank may be reduced by applying an invert signal decoded from the input vector. This principle of exploiting symmetry among the set of output states may also applied more generally to reduce the size of the state storage by a factor of 2. FIG. 21 shows a block diagram of an implementation 200 of a digital filter according to another embodiment of the invention. In this implementation, set of logic gates 210 produces an invert signal S52, and an inverter (here, XOR gate X50) produces an output signal S70 based on selected state signal S50 (selected from outputs of state storage 220) and invert signal S52.

Figure 22:
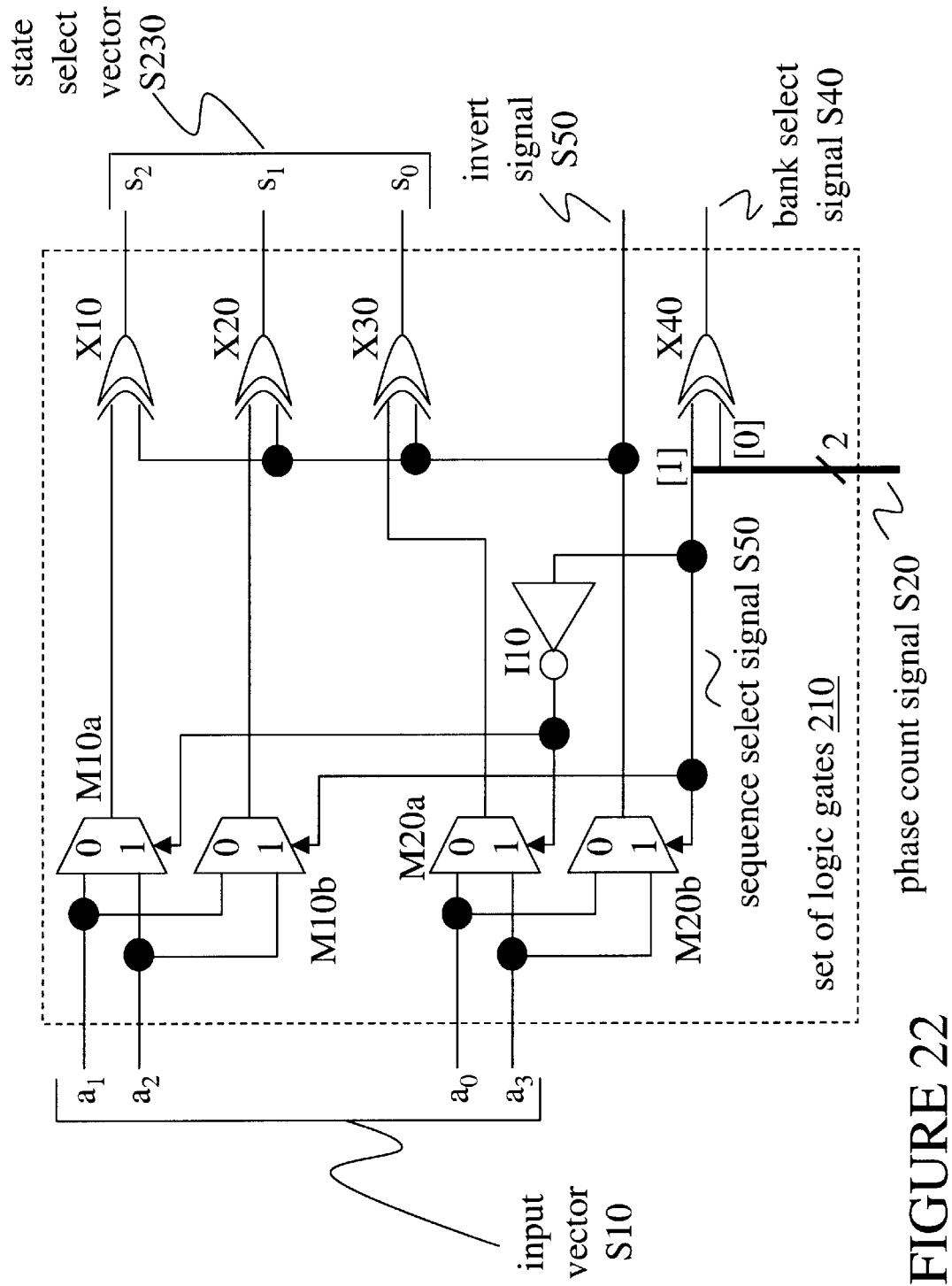
FIG. 22 shows a block diagram of an exemplary implementation of set of logic gates 210.

FIG. 22 shows a block diagram of an exemplary implementation of set of logic gates 210 to a type 2 FIR filter bank decomposition as shown in FIG. 5C. In this implementation, the output of a multiplexer of one of the multiplexer pairs M10, M20 serves as invert signal S50. XOR gates X10, X20, and X30 receive invert signal S50 and the signals from the other multiplexers and produce the components of state select vector S230. As state storage 220 is only half as large as state storage 120, state select vector S230 is one bit narrower than state select vector S30 as shown in FIG. 7.

In a case where components of input vector S10 have more than one bit, one bit of the output of a multiplexer of one of the multiplexer pairs M10, M20 serves as invert signal S50. In such case, the other bits of the output of that multiplexer are inputted to an XOR gate that receives invert signal S50. Like XOR gates X10, X20, and X30 described above, this XOR gate also produces components of state select vector S230.

Figure 23:
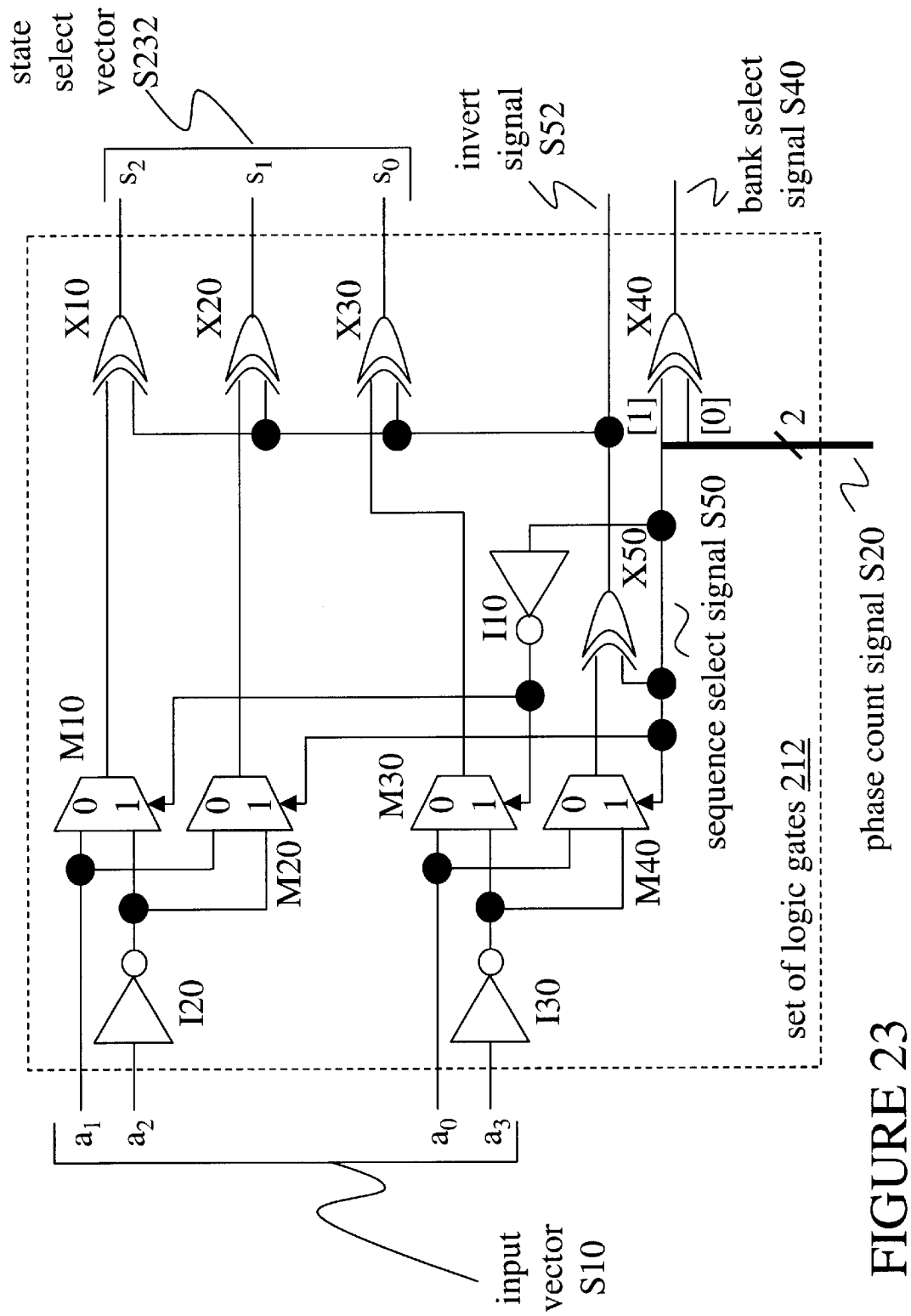
FIG. 23 shows a block diagram of an exemplary implementation 212 of set of logic gates 210.

FIG. 23 shows a block diagram of an exemplary implementation 212 of set of logic gates 210 for a type 4 FIR filter. In this implementation, XOR gate X50 receives sequence select signal S50 and one bit of the output of a multiplexer of one of the multiplexer pairs M10, M20 and produces invert signal S52.

Implementations of filter 200 and set of logic gates 210 may be extended to cases of filter coefficient vectors of arbitrary length, and/or to various odd/even relationships of L and N/L, as described above with respect to implementations of filter 100 and set of logic gates 110.

Figure 24:
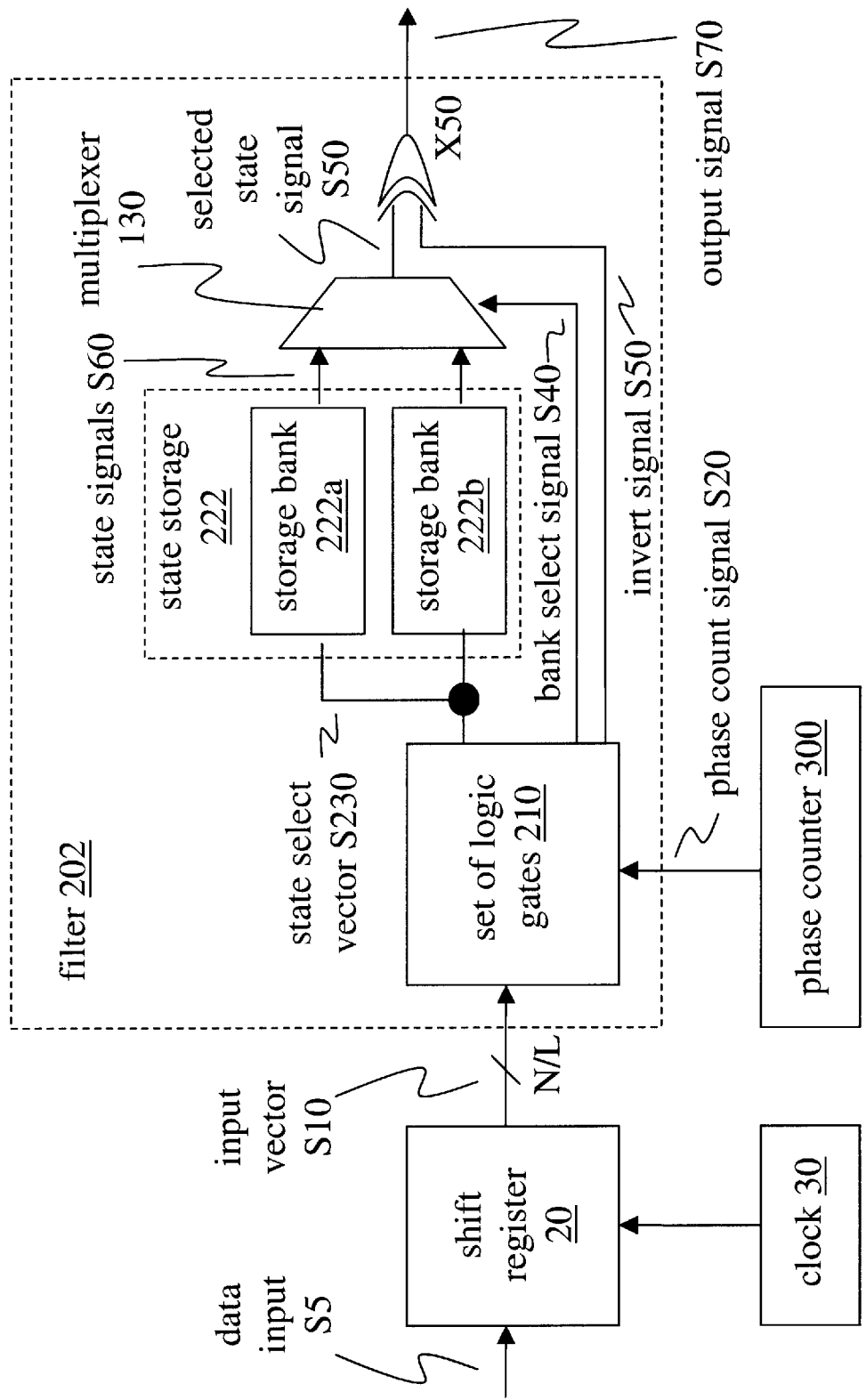
FIG. 24 shows a block diagram of one binary-input implementation 202 of a filter 200.

FIG. 24 shows a block diagram of one binary-input implementation 202 of a filter 200 that is suitable for application to the example illustrated in FIG. 5C. In this implementation, state storage 222 has two storage banks 222a (bank 0) and 222b (bank 1), with bank 0 storing the eight values represented by the expression $(h_0 \pm h_3 \pm h_4 \pm h_7)$ and bank 1 storing the eight values represented by the expression $(h_1 \pm h_2 \pm h_5 \pm h_6)$.

Figure 25:
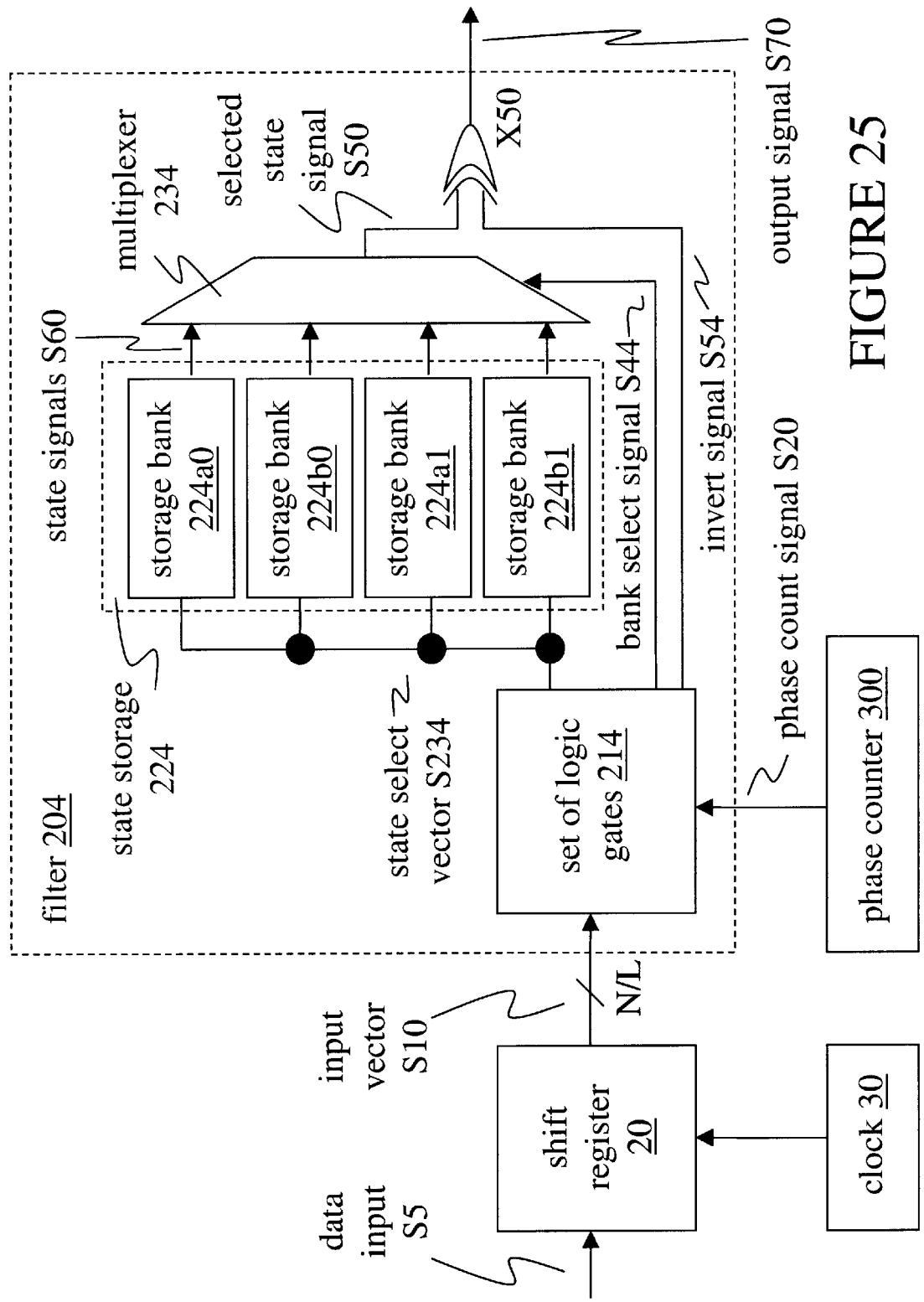
FIG. 25 shows a block diagram of one implementation 204 of a filter 200.

In some applications, it may be desirable to divide one or more of the storage banks into subbanks. For example, it may be desired to modify a state storage 222 as described above by dividing each bank into two subbanks, each subbank receiving the state select vector and producing a state signal. FIG. 25 shows a block diagram of one such implementation 204 in which subbanks 224a0 and 224a1 each store the four values represented by the expression $(s_0+s_1 \pm s_2 \pm s_3)[(h_0 \pm h_3 \pm h_4 \pm h_7)$ and $(h_1+h_2 \pm h_5 \pm h_6)$, respectively], while subbanks 224b0 and 224b store the four values represented by the expression $(s_0-s_1 \pm s_2 \pm s_3)$ $[(h_0-h_3 \pm h_4 \pm h_7)$ and $(h_1-h_2 \pm h_5 \pm h_6)$, respectively].

Figure 26:
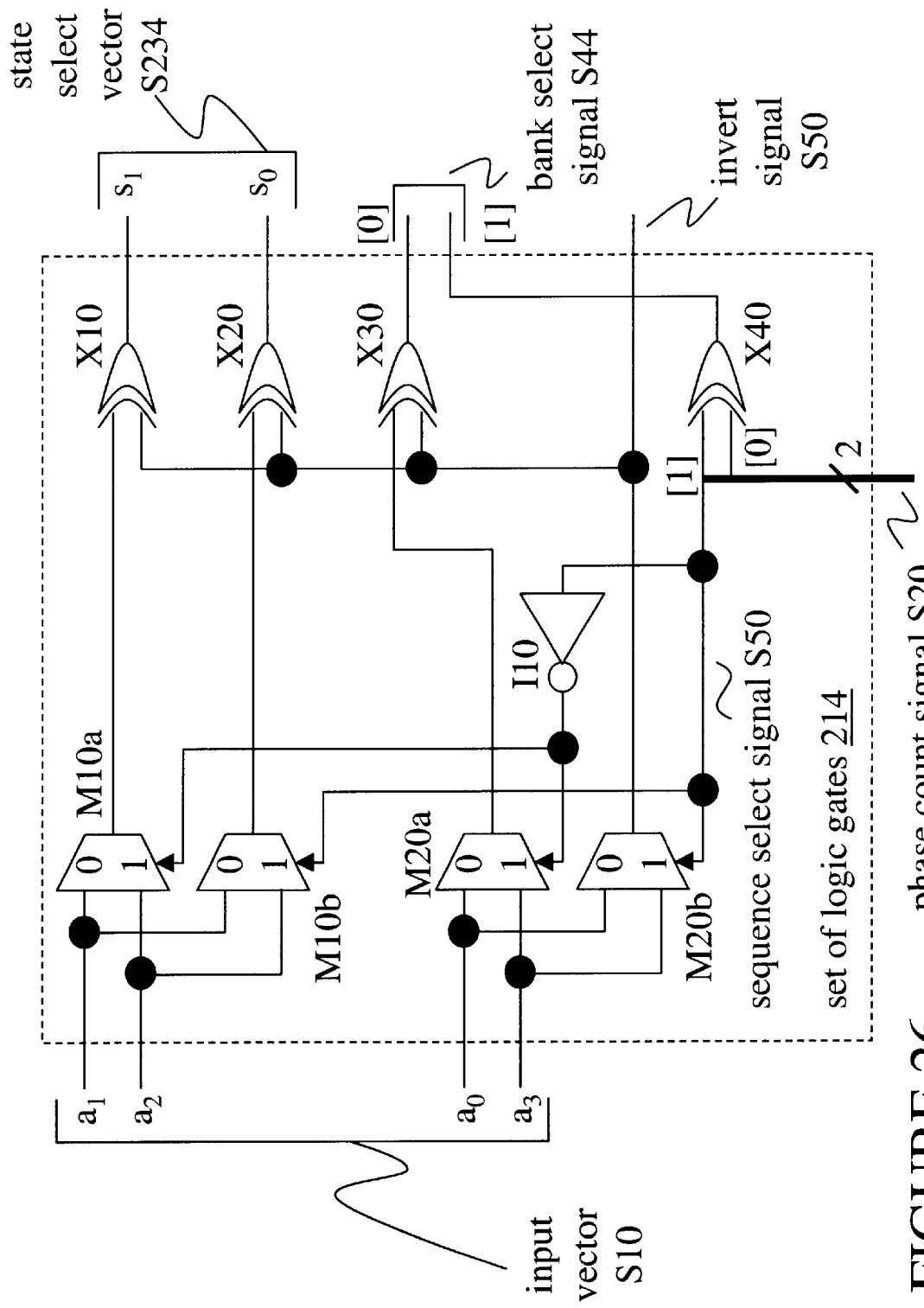
FIG. 26 shows a block diagram of a set of logic gates 214.

FIG. 26 shows a block diagram of a set of logic gates 214 suitable for use in filter 204. Although the total number of stored states in state storage 224 is the same as the total number of stored states in state storage 222, the number of banks receiving the state select vector and producing a state signal is greater in filter 204 (here, by a factor of two). Consequently, multiplexer 134 selects from among a greater number of inputs. At the same time, the number of states stored in each bank 224 is less (here, also by a factor of two) such that state select vector S234 may be more narrow than state select vector S230.

Figure 27:
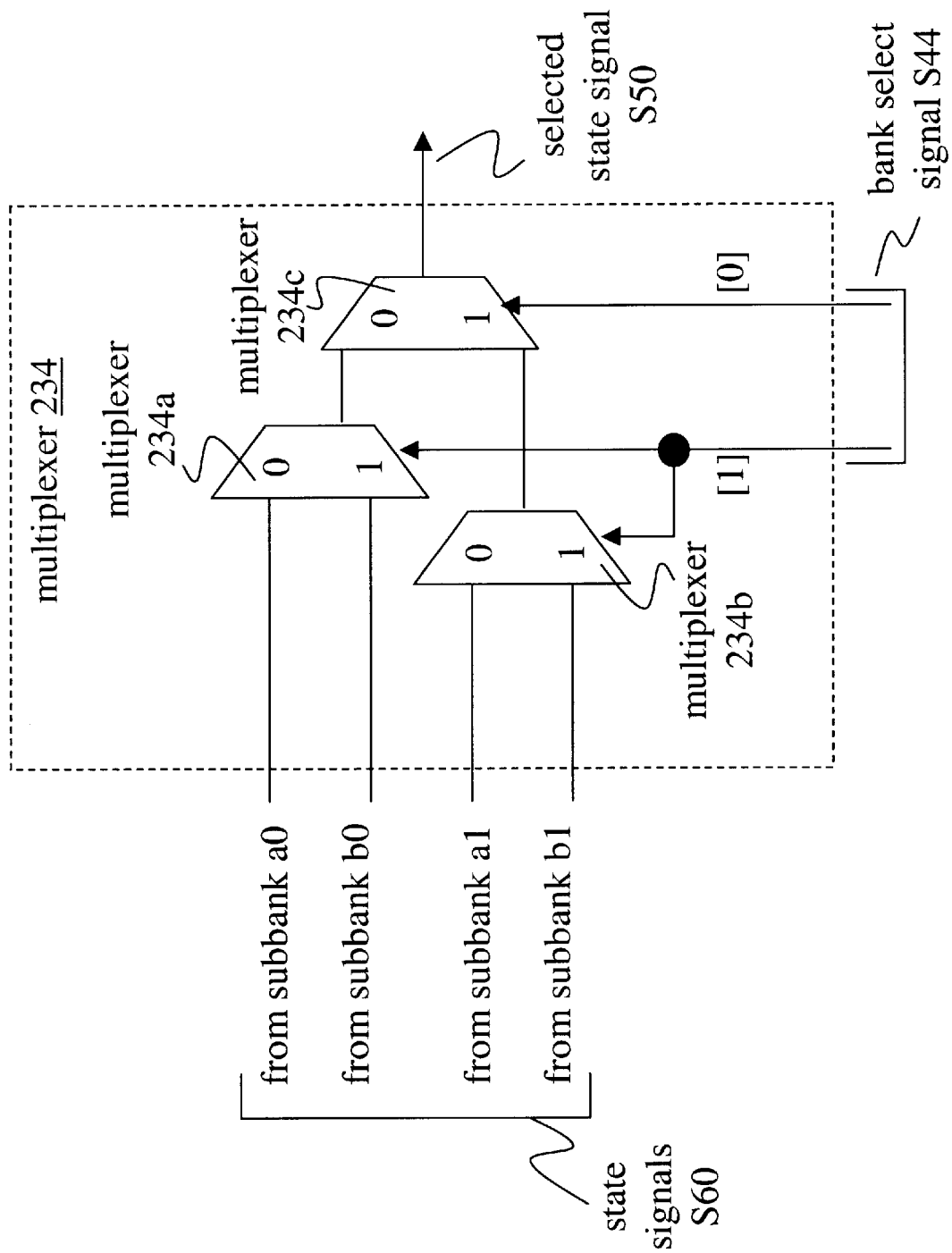
FIG. 27 shows an exemplary implementation of multiplexer 234.

In this particular example, set 214 is derived from set 210 by moving one of the state select vector components (here, the component corresponding to state $s_o$ in set 210) to bank select signal S44. In other applications, a different number of banks may be implemented, with a corresponding exchange of components between the state select vector and the bank select signal. FIG. 27 shows a block diagram of an exemplary implementation of multiplexer 234.

Figure 28:
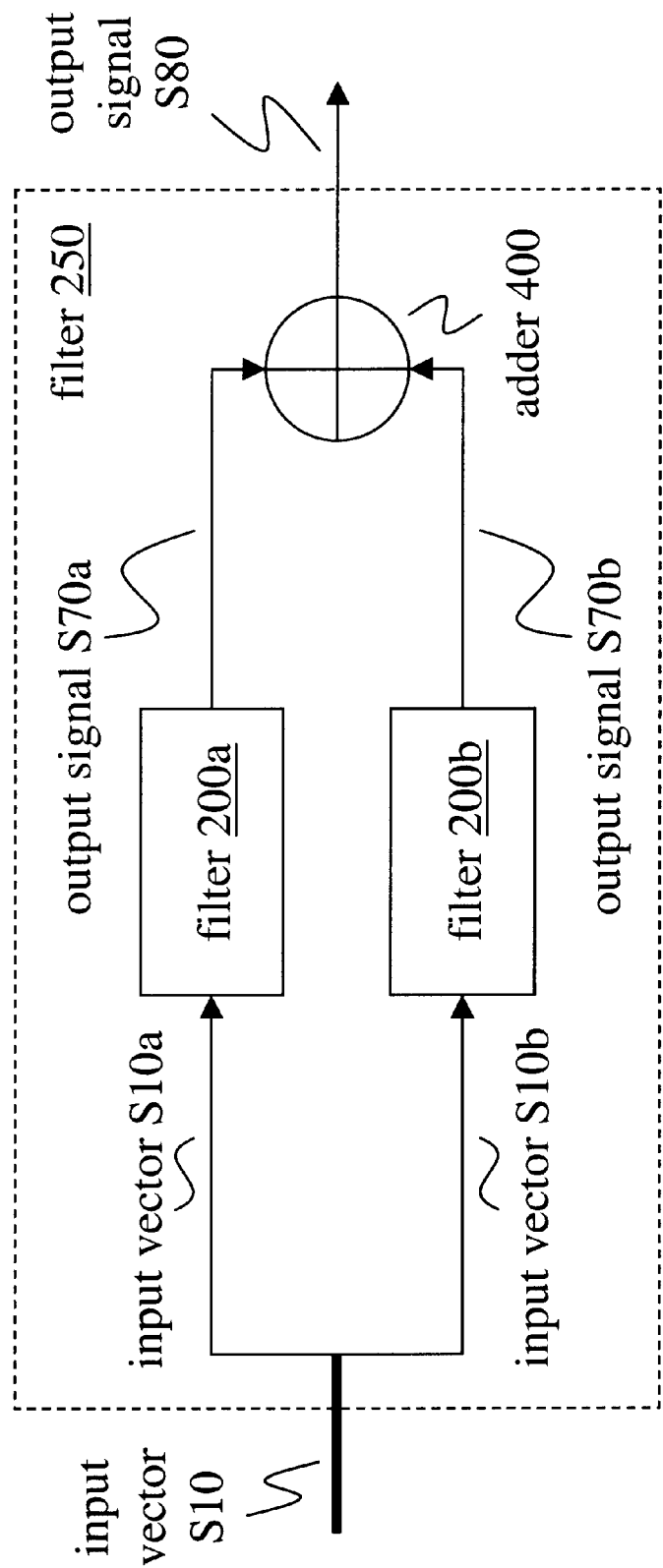
FIG. 28 shows a block diagram of a filter 250 according to an embodiment of the invention.

FIG. 28 shows a block diagram of a filter 250 according to an embodiment of the invention. In this embodiment, input vector S10 is split into two separate input vectors S10a and S10b, each being inputted to a filter 100 (constructed e.g. as shown in FIG. 6A). The output signals S70 produced by filters 100 are added by adder 400 to obtain filter output signal S80. In one implementation, filters 200a,b receive the same phase count signal; in another implementation, filters 200a,b receive the same sequence select and bank select signals (generated e.g. as described herein).

Figure 29A:
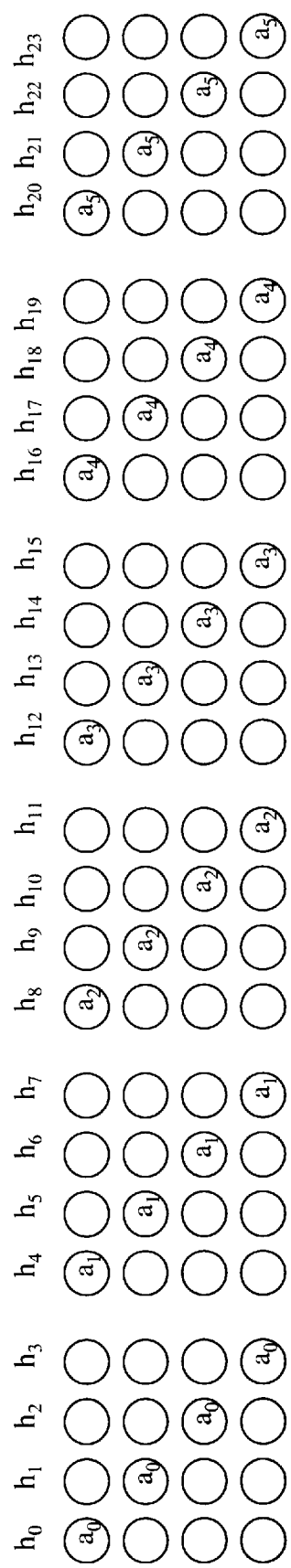
FIG. 29A shows a phase decomposition of a 24-tap FIR filter.
Figure 29B:
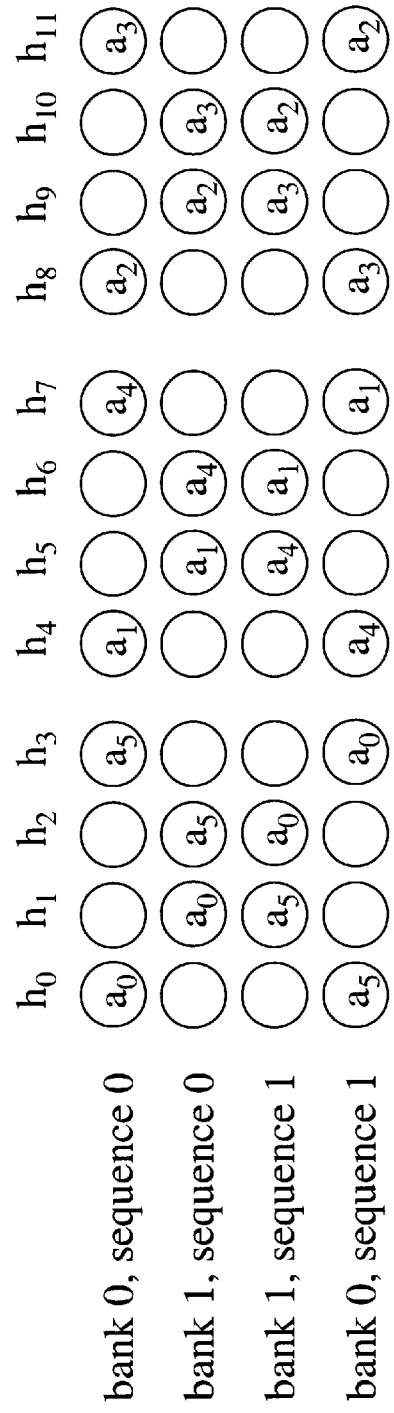
FIG. 29B shows a reduction of the decomposition of FIG. 29A.

FIG. 29A shows a phase decomposition of a 24-tap FIR filter (here, L=4), and FIG. 29B shows a reduction of this symmetric (or anti-symmetric) filter into ceil(L/2) banks. Assuming a binary input, the total number of stored states in an application of filter 200 to this example may reach $(L \times 2^{(N/L)-1})$ or 128.

Figures 30A, 30B:
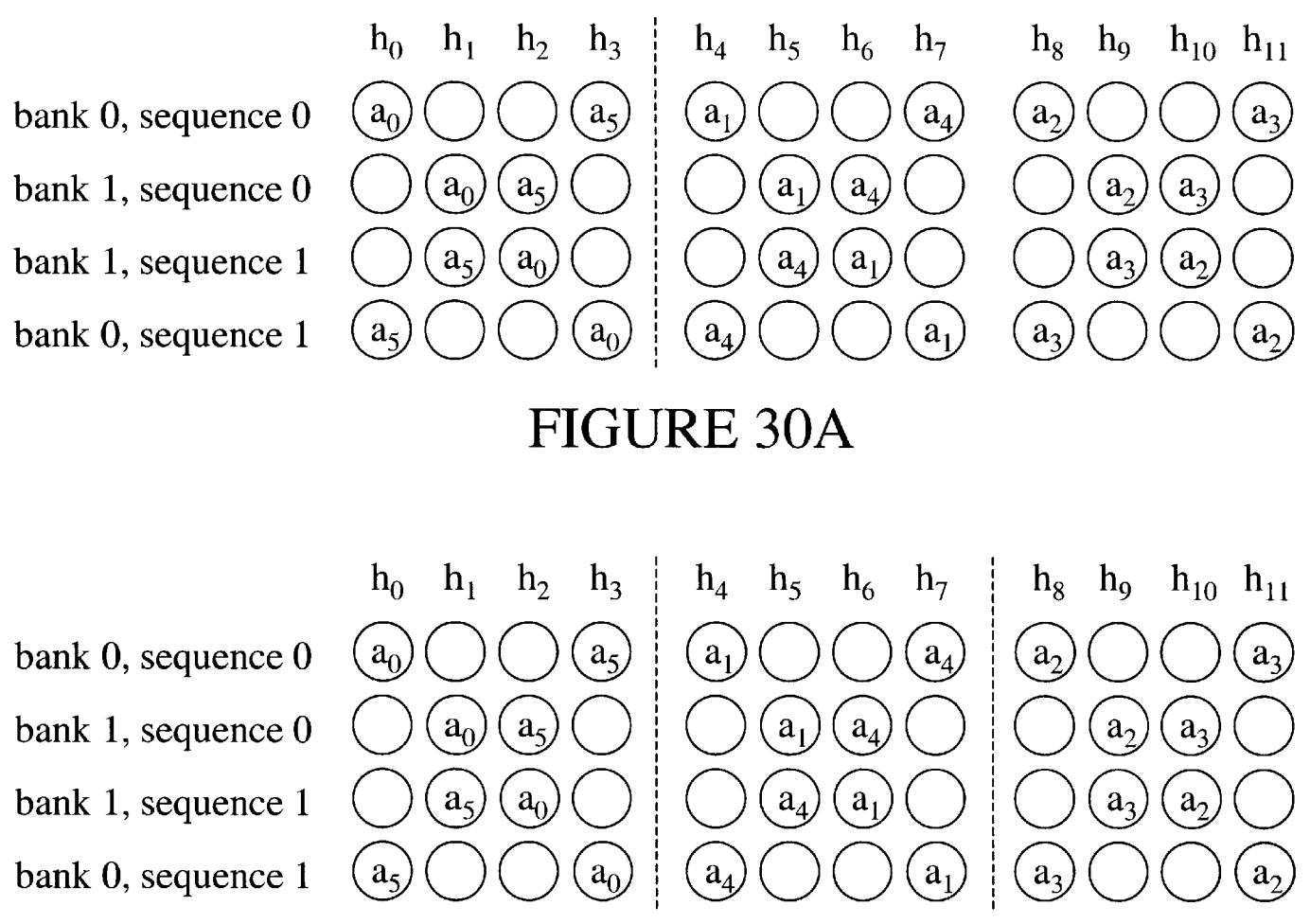

FIG. 30A shows a division of the reduction of FIG. 29B into two sections. In an exemplary application of filter 250 to this filter coefficient vector, input vector S10a includes the components of the first section $(h_0-h_3)$ and input vector S10b includes the components of the second section $(h_4-h_{11})$. The total number of stored states in each filter 100i may reach L times 2 to the power (length of input vector S10i minus 1). Assuming a binary input in this example, this limit may be calculated as $(4 \times 2^{2-1})$ or 8 for filter 200a, plus $(4 \times 2^{4-1})$ or 32 for filter 200b for a total of 40.

An even further reduction in the total number of stored states may be achieved by using the three-part division shown in FIG. 30B. In this example, filter 250 is implemented with three filters 100, each receiving a four-component input vector S10i, and a three-input adder to receive the three output signals S70 and to produce the filter output signal S80. In this example, the total number of stored states may reach only 24 (or 3×8).

In another example, FIG. 31A shows a phase decomposition of a 48-tap four-times-oversampled symmetric FIR filter as shown in TABLE 1. Each of the four phase expressions may then be divided into three four-term blocks as shown in FIG. 31B, each block having 16 possible values (for binary input) and serving as an input vector to one of the filters in a three-filter implementation as described above.

Note that the particular grouping of input values shown in FIG. 31B is only one of many possible groupings. For example, FIG. 31C shows another such grouping, which differs from that of FIG. 31B in the placement of coefficients $h_4$–$h_7$ and $h_8$–$h_{11}$. A particular grouping may also be chosen on the basis of the magnitude of the corresponding filter coefficients, such that blocks having filter coefficients of low magnitude may be formed for processing using a more narrow logical bus width, storage area, etc. than blocks having filter coefficients of higher magnitude.

In a further example, the stored state values may be normalized. In one implementation, a normalization of the filter coefficient vector is calculated according to a factor determined by dividing the maximum possible output value of the filter (e.g. as determined by the unnormalized filter coefficient vector) by the maximum value that may be represented in the number of bits provided for the filter output. In an exemplary application, normalization is used to support an integer implementation of a filter coefficient vector having floating-point components.

Figure 32:
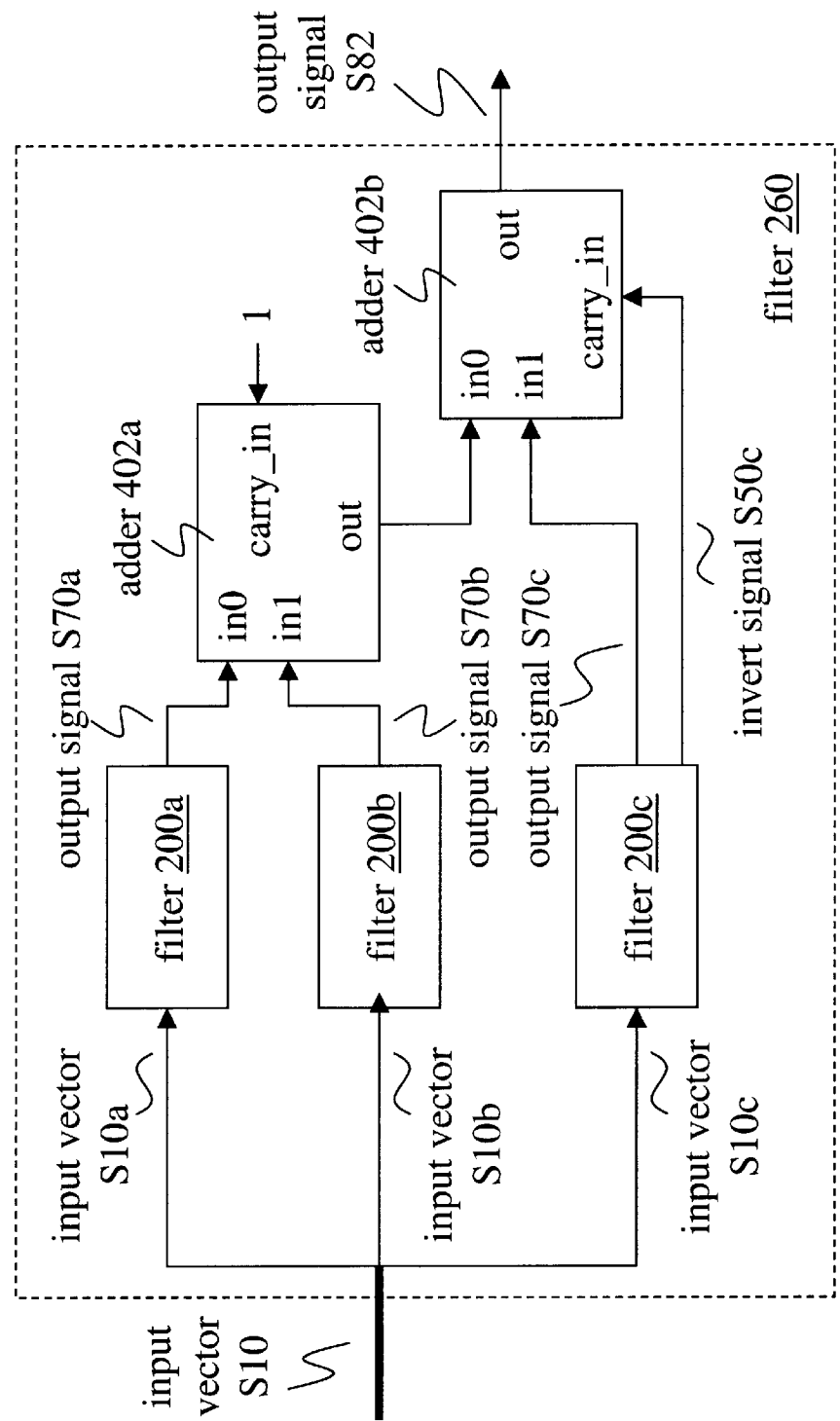
FIG. 32 shows a block diagram of and implementation 260 of filter 250.

FIG. 32 shows a block diagram of an implementation 260 of filter 250 as applied to the 48-tap filter of TABLE 1 divided as shown in FIG. 31B. In this example, output signals S70a, S70b, and S70c are eight, nine, and eleven bits wide, respectively, and the outputs of adders 402a and 402b are nine and eleven bits wide, respectively. Filters 200a and 200b are configured to output signed integer values in offset two's complement representation, while filter 200c and adder 402b are configured to output signed integer values in two's complement representation. This particular configuration eliminates the need for an additional adder to process the carry bits from the three filters.

The foregoing presentation of the described embodiments is provided to enable any person skilled in the art to make or use the present invention. Various modifications to these embodiments are possible, and the generic principles presented herein may be applied to other embodiments as well. For example, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit.

In other implementations of filters as described herein, the actual number of stored states may be lower than the limits indicated above. For example, if it is known that certain forms of the input vector will not be encountered in a particular application, states corresponding to those forms need not be stored.

Reduction of the number of stored states by producing and applying an invert signal is described herein. A similar reduction may be performed with respect to other linear relations that may exist among the possible filter states. For example, states in a first portion of the set of possible filter states may be expressible as a multiple of corresponding states in a second portion of the set of possible filter states. In such case, it may be more efficient in a particular application to store only the second portion of states and to derive states of the first portion as needed at runtime.

A filter according to an embodiment of the invention may also be used in conjunction with a circuit configuration as described in copending U.S. Provisional Patent Application No. 60/245,232, entitled "CIRCUIT FOR DIGITAL DATA TRANSMISSION," attorney docket No. 010086P, filed on Nov. 3, 2000. Thus, the present invention is not intended to be limited to the embodiments shown above but rather is to be accorded the widest scope consistent with the principles and novel features disclosed in any fashion herein.

We claim:

1. A system for digital filtering, said system including a digital filter comprising:
   a set of logic gates, said set being configured and arranged to receive an input vector and a phase count signal and to produce a state select vector based on at least a portion of the phase count signal and at least a portion of the input vector;
   a state storage including a plurality of storage banks, each storage bank configured and arranged to receive the state select vector and to produce a state signal indicated by the state select vector, the state storage further including at least one lookup table having values based on components of an antisymmetric finite-impulse-response filter coefficient vector; and
   a multiplexer configured and arranged to receive the plurality of state signals and a bank select signal based on at least a portion of the phase count signal and to pass a selected state signal, said selected state signal corresponding to the bank select signal.

2. A system for digital filtering, said system including a digital filter comprising:
   a set of logic gates, said set being configured and arranged to receive an input vector and a phase count signal and to produce a state select vector based on at least a portion of the phase count signal and at least a portion of the input vector;
   a state storage including a plurality of storage banks, each storage bank configured and arranged to receive the state select vector and to produce a state signal indicated by the state select vector, the state storage further including combinatorial logic configured and arranged to produce a zero select signal based on at least a portion of the state select vector; and
   a multiplexer configured and arranged to receive the plurality of state signals and a bank select signal based on at least a portion of the phase count signal and to pass a selected state signal, said selected state signal corresponding to the bank select signal.

3. The system for digital filtering according to claim 2, wherein each among the plurality of storage banks includes at least one lookup table having values based on components of a finite-impulse-response filter coefficient vector.

4. A system for digital filtering, said system including a digital filter comprising:
   a set of logic gates, said set being configured and arranged to receive an input vector and a phase count signal and to produce a state select vector based on at least a portion of the phase count signal and at least a portion of the input vector, wherein the set of logic gates is configured and arranged to map the input vector to the state select vector according to a sequence select signal based on at least a portion of the phase count signal;
   a state storage including a plurality of storage banks, each storage bank configured and arranged to receive the state select vector and to produce a state signal indicated by the state select vector; and
   a multiplexer configured and arranged to receive the plurality of state signals and a bank select signal based on at least a pardon of the phase count signal and to pass a selected state signal, said selected state signal corresponding to the bank select signal.

5. A system for digital filtering, said system including a digital filter comprising:
   a set of logic gates, said set being configured and arranged to receive an input vector and a phase count signal and to produce a state select vector based on at least a portion of the phase count signal and at least a portion of the input vector;

a state storage including a plurality of storage banks, each storage bank configured and arranged to receive the state select vector and to produce a state signal indicated by the state select vector;

a multiplexer configured and arranged to receive the plurality of state signals and a bank select signal based on at least a portion of the phase count signal and to pass a selected state signal, said selected state signal corresponding to the bank select signal; and an inverter configured and arranged to receive the selected state signal and an invert signal and to produce an output signal.

6. The system for digital filtering according to claim 5, wherein the invert signal is based on the phase count signal.

7. The system for digital filtering according to claim 5, wherein the components of at least a portion of the state select vector are based on the invert signal.

8. A system for digital filtering, said system including a digital filter comprising:

a set of logic gates, said set being configured and arranged to receive an input vector and a phase count signal and to produce a state select vector based on at least a portion of the phase count signal and at least a portion of the input vector;

a state storage including a plurality of storage banks, each storage bank configured and arranged to receive the state select vector and to produce a stale signal indicated by the state select vector;

a multiplexer configured and arranged to receive the plurality of state signals and a bank select signal based on at least a portion of the phase count signal and to pass a selected state signal, said selected state signal corresponding to the bank select signal;

a shift register configured and arranged to receive an input signal according to a clock signal and to produce the input vector; and a phase counter configured and arranged to produce the phase count signal, wherein a counting rate of the phase count signal is a multiple of the rate of the clock signal.

9. A system for digital filtering, said system including:

a digital filter comprising a set of logic gates, said set being configured and arranged to receive an input vector and a phase count signal and to produce a state select vector based on at least a portion of the phase count signal and at least a portion of the input vector, a state storage including a plurality of storage banks, each storage bank configured and arranged to receive the state select vector and to produce a state signal indicated by the state select vector, and a multiplexer configured and arranged to receive the plurality of state signals and a bank select signal based on at least a portion of the phase count signal and to pass a selected state signal, said selected state signal corresponding to the bank select signal;

a second filter configured and arranged to receive a second input vector and to produce a signal based on a second selected state signal; and an adder configured and arranged to add a signal based on the selected state signal and the signal based on a second selected state signal.

10. The system for digital filtering according to claim 9, wherein said system is configured and arranged to receive values of an input signal over time, and wherein the components of the input vector correspond to values of the input signal received over a first time period, and wherein the components of the second input vector correspond to values of the input signal received over a second time period different than the first time period.

11. A system for digital filtering, said system including:

a shift register configured and arranged to receive the input signal and to produce a plurality of input vectors;

a plurality of digital filters configured and arranged to receive a phase count signal, each digital filter comprising:

a set of logic gates, said set being configured and arranged to receive a corresponding input vector and the phase count signal and to produce a state select vector based on at least a portion of the phase count signal and at least a portion of the input vector, a state storage including a plurality of storage banks, each storage bank configured and arranged to receive the state select vector and to produce a state signal indicated by the state select vector, and a multiplexer configured and ranged to receive the plurality of state signals and a bank select signal based on at least a portion of the phase count signal and to pass a selected state signal, said selected state signal corresponding to the bank select signal; and at least one adder configured and arranged to produce a sum based on the plurality of selected state signals, wherein the components of each of the plurality of input vectors correspond to values of the input signal received over a corresponding time period, each input vector corresponding to a different time period.

12. The system for digital filtering according to claim 11, wherein the state storage of at least one of the digital filters includes at least one lookup table.

13. The system for digital filtering according to claim 12, wherein the at least one lookup table has values based on components of a finite-impulse-response filter coefficient vector.

14. The system for digital filtering according to claim 11, wherein the set of logic gates of at least one digital filter is configured and arranged to map the corresponding input vector to the corresponding state select vector according to a sequence select signal based on at least a portion of the phase count signal.

15. The system for digital filtering according to claim 11, wherein at least one of the digital filters further comprises an inverter configured and arranged to receive the corresponding selected state signal and an invert signal and to produce an output signal.

16. The system for digital filtering according to claim 15, wherein the invert signal is based on the phase count signal.

17. The system for digital filtering according claim 15, wherein the components of at least a portion of the corresponding state select vector are based on the invert signal.

18. A method of digital filtering, said method comprising:

receiving an input vector and a phase count signal;

mapping the input vector to a state select vector according to at least a portion of the phase count signal;

inputting the state select vector to a state storage, said state storage comprising a plurality of storage banks;

receiving a state signal corresponding to the state select vector from each of the plurality of storage banks; and selecting a state signal from among the plurality of state signals according to a bank select signal.

19. The method of digital filtering according to claim 18, wherein the state storage has a plurality of stored values, and wherein each of at least a subset of the stain signals is based on a corresponding one of the stored values.

20. The method of digital filtering according to claim 19, wherein the stored values are based on components of a finite-impulse-response filter coefficient vector.

21. The method of digital filtering according to claim 19, wherein the stored values are normalized with respect to a predetermined maximum filter output value.

22. The method of digital filtering according to claim 18, wherein the bank select signal is based on at least a portion of the input vector.

* * * * *